(12) United States Patent
Yamazaki et al.

(10) Patent No.: US 7,741,775 B2
(45) Date of Patent: Jun. 22, 2010

(54) ELECTRO-OPTICAL DEVICE AND ELECTRONIC DEVICE

(75) Inventors: Shunpei Yamazaki, Tokyo (JP); Jun Koyama, Kanagawa (JP); Kunitaka Yamamoto, Kanagawa (JP); Toshimitsu Konuma, Kanagawa (JP)

(73) Assignee: Semiconductor Energy Laboratories Co., Ltd., Kanagawa-Ken (JP)

(*) Notice: Subject to any disclaimer, the term of this patent is extended or adjusted under 35 U.S.C. 154(b) by 0 days.

(21) Appl. No.: 11/407,145

(22) Filed: Apr. 20, 2006

(65) Prior Publication Data
US 2006/0192205 A1    Aug. 31, 2006

Related U.S. Application Data

(62) Division of application No. 09/578,895, filed on May 26, 2000.

(30) Foreign Application Priority Data
Jun. 7, 1999    (JP) ................................. 11-158787

(51) Int. Cl.
*H01L 29/04* (2006.01)
(52) U.S. Cl. .................. 313/512; 313/506; 313/507; 257/72
(58) Field of Classification Search .......... 313/495–512; 315/169.3, 169.4; 257/40, 79, 72, 181.1, 257/194; 428/690; 445/24–25; 349/139
See application file for complete search history.

(56) References Cited

U.S. PATENT DOCUMENTS

| | | | |
|---|---|---|---|
| 4,040,073 | A | 8/1977 | Luo |
| 4,356,429 | A | 10/1982 | Tang |
| 4,357,557 | A | 11/1982 | Inohara et al. |
| 4,530,750 | A | 7/1985 | Aisenberg et al. |
| 4,539,507 | A | 9/1985 | VanSlyke et al. |

(Continued)

FOREIGN PATENT DOCUMENTS

CN        2291695        9/1998

(Continued)

OTHER PUBLICATIONS

Specification, Claims and Drawings of U.S. Appl. No. 10/754,702, filed Jan. 12, 2004.

(Continued)

*Primary Examiner*—Bumsuk Won
*Assistant Examiner*—Elmito Breval
(74) *Attorney, Agent, or Firm*—Nixon Peabody LLP; Jeffrey L. Costellia

(57) ABSTRACT

An object of the present invention is to provide an EL display device having a high operation performance and reliability.

The switching TFT 201 formed within a pixel has a multi-gate structure, which is a structure which imposes an importance on reduction of OFF current value. Further, the current control TFT 202 has a channel width wider than that of the switching TFT to make a structure appropriate for flowing electric current. Morever, the LDD region 33 of the current control TFT 202 is formed so as to overlap a portion of the gate electrode 35 to make a structure which imposes importance on prevention of hot carrier injection and reduction of OFF current value.

57 Claims, 23 Drawing Sheets

U.S. PATENT DOCUMENTS

| | | | |
|---|---|---|---|
| 4,586,790 A * | 5/1986 | Umeda et al. | 349/102 |
| 4,602,192 A * | 7/1986 | Nomura et al. | 315/169.3 |
| 4,720,432 A | 1/1988 | VanSlyke et al. | |
| 4,769,292 A | 9/1988 | Tang et al. | |
| 4,885,211 A | 12/1989 | Tang et al. | |
| 4,950,950 A | 8/1990 | Perry et al. | |
| 4,975,338 A | 12/1990 | Kageyama et al. | |
| 5,003,221 A | 3/1991 | Shimizu | |
| 5,047,687 A | 9/1991 | VanSlyke | |
| 5,059,861 A | 10/1991 | Littman et al. | |
| 5,059,862 A | 10/1991 | VanSlyke et al. | |
| 5,061,617 A | 10/1991 | Maskasky | |
| 5,072,263 A | 12/1991 | Watanabe et al. | |
| 5,073,446 A | 12/1991 | Scozzafava et al. | |
| 5,107,175 A | 4/1992 | Hirano et al. | |
| 5,124,204 A | 6/1992 | Yamashita et al. | |
| 5,151,629 A | 9/1992 | VanSlyke | |
| 5,151,632 A | 9/1992 | Troxell | |
| 5,189,405 A | 2/1993 | Yamashita et al. | |
| 5,190,794 A | 3/1993 | Yoshino et al. | |
| 5,206,749 A | 4/1993 | Zavracky et al. | |
| 5,217,700 A | 6/1993 | Kurihara et al. | |
| 5,247,190 A | 9/1993 | Friend et al. | |
| 5,270,267 A | 12/1993 | Ouellet | |
| 5,294,869 A | 3/1994 | Tang et al. | |
| 5,294,870 A | 3/1994 | Tang et al. | |
| 5,317,236 A | 5/1994 | Zavracky et al. | |
| 5,323,042 A | 6/1994 | Matsumoto | |
| 5,338,364 A | 8/1994 | Kurihara et al. | |
| 5,399,502 A | 3/1995 | Friend et al. | |
| 5,412,240 A | 5/1995 | Inoue et al. | |
| 5,412,493 A | 5/1995 | Kunii et al. | |
| 5,438,241 A | 8/1995 | Zavracky et al. | |
| 5,482,896 A | 1/1996 | Tang | |
| 5,496,597 A | 3/1996 | Soininen et al. | |
| 5,503,731 A | 4/1996 | Konuma et al. | |
| 5,518,940 A | 5/1996 | Hodate et al. | |
| 5,528,056 A | 6/1996 | Shimada et al. | |
| 5,530,269 A | 6/1996 | Tang | |
| 5,552,668 A | 9/1996 | Hirose et al. | |
| 5,583,347 A | 12/1996 | Misawa et al. | |
| 5,610,738 A | 3/1997 | Sasano et al. | |
| 5,619,044 A | 4/1997 | Makita et al. | |
| 5,640,067 A | 6/1997 | Yamauchi et al. | |
| 5,641,991 A | 6/1997 | Sakoh | |
| 5,642,213 A | 6/1997 | Mase et al. | |
| 5,643,826 A | 7/1997 | Ohtani et al. | |
| 5,654,811 A | 8/1997 | Spitzer et al. | |
| 5,661,371 A | 8/1997 | Salerno et al. | |
| 5,670,792 A | 9/1997 | Utsugi et al. | |
| 5,674,304 A | 10/1997 | Fukada et al. | |
| 5,677,600 A | 10/1997 | Takahashi et al. | |
| 5,680,165 A | 10/1997 | Takizawa et al. | |
| 5,680,185 A | 10/1997 | Kobayashi et al. | |
| 5,684,365 A | 11/1997 | Tang et al. | |
| 5,686,360 A | 11/1997 | Harvey, III et al. | |
| 5,688,551 A | 11/1997 | Littman et al. | |
| 5,693,956 A | 12/1997 | Shi et al. | |
| 5,703,382 A | 12/1997 | Hack et al. | |
| 5,708,484 A | 1/1998 | Someya et al. | |
| 5,712,495 A | 1/1998 | Suzawa | |
| 5,712,652 A | 1/1998 | Sato et al. | |
| 5,729,308 A | 3/1998 | Yamazaki et al. | |
| 5,747,830 A | 5/1998 | Okita | |
| 5,747,930 A | 5/1998 | Utsugi | |
| 5,748,165 A | 5/1998 | Kubota et al. | |
| 5,757,126 A | 5/1998 | Harvey, III et al. | |
| 5,771,562 A | 6/1998 | Harvey, III et al. | |
| 5,790,213 A | 8/1998 | Sasaki et al. | |
| 5,798,746 A | 8/1998 | Koyama | |
| 5,811,177 A | 9/1998 | Shi et al. | |
| 5,824,374 A | 10/1998 | Bradley et al. | |
| 5,839,456 A | 11/1998 | Han | |
| 5,853,905 A | 12/1998 | So et al. | |
| 5,856,689 A | 1/1999 | Suzawa | |
| 5,859,627 A | 1/1999 | Hoshiya et al. | |
| 5,882,761 A * | 3/1999 | Kawami et al. | 428/69 |
| 5,889,459 A | 3/1999 | Hattori et al. | |
| 5,895,935 A | 4/1999 | Yamazaki et al. | |
| 5,897,328 A | 4/1999 | Yamauchi et al. | |
| 5,903,249 A | 5/1999 | Koyama et al. | |
| 5,904,514 A | 5/1999 | Konuma et al. | |
| 5,909,081 A | 6/1999 | Eida et al. | |
| 5,923,962 A | 7/1999 | Ohtani et al. | |
| 5,929,487 A | 7/1999 | Fukada et al. | |
| 5,943,107 A | 8/1999 | Kadota et al. | |
| 5,952,708 A | 9/1999 | Yamazaki | |
| 5,952,778 A | 9/1999 | Haskal et al. | |
| 5,962,962 A | 10/1999 | Fujita et al. | |
| 5,990,542 A | 11/1999 | Yamazaki | |
| 5,990,615 A | 11/1999 | Sakaguchi et al. | |
| 6,011,607 A | 1/2000 | Yamazaki et al. | |
| 6,013,930 A | 1/2000 | Yamazaki et al. | |
| 6,028,325 A | 2/2000 | Yamazaki | |
| 6,034,748 A | 3/2000 | Furuta | |
| 6,046,547 A | 4/2000 | Nishio et al. | |
| 6,049,167 A | 4/2000 | Onitsuka et al. | |
| 6,057,647 A | 5/2000 | Kurosawa et al. | |
| 6,084,248 A | 7/2000 | Inoue | |
| 6,097,459 A | 8/2000 | Shimada et al. | |
| 6,100,954 A | 8/2000 | Kim et al. | |
| 6,111,270 A | 8/2000 | Xu et al. | |
| 6,114,183 A | 9/2000 | Hamada et al. | |
| 6,114,715 A | 9/2000 | Hamada | |
| 6,115,090 A | 9/2000 | Yamazaki | |
| 6,128,060 A | 10/2000 | Shimada et al. | |
| 6,146,225 A | 11/2000 | Sheats et al. | |
| 6,147,451 A | 11/2000 | Shibata et al. | |
| 6,150,187 A | 11/2000 | Zyung et al. | |
| 6,150,668 A | 11/2000 | Bao et al. | |
| 6,160,272 A | 12/2000 | Arai et al. | |
| 6,165,543 A | 12/2000 | Otsuki et al. | |
| 6,165,824 A | 12/2000 | Takano et al. | |
| 6,166,397 A | 12/2000 | Yamazaki et al. | |
| 6,169,293 B1 | 1/2001 | Yamazaki | |
| 6,184,559 B1 | 2/2001 | Hayakawa et al. | |
| 6,194,837 B1 | 2/2001 | Ozawa | |
| 6,195,142 B1 | 2/2001 | Gyotoku et al. | |
| 6,198,217 B1 | 3/2001 | Suzuki et al. | |
| 6,198,220 B1 | 3/2001 | Jones et al. | |
| 6,198,225 B1 | 3/2001 | Kano et al. | |
| 6,204,534 B1 | 3/2001 | Adan | |
| 6,204,535 B1 | 3/2001 | Yamazaki et al. | |
| 6,218,219 B1 | 4/2001 | Yamazaki et al. | |
| 6,236,064 B1 | 5/2001 | Mase et al. | |
| 6,239,470 B1 | 5/2001 | Yamazaki | |
| 6,246,179 B1 | 6/2001 | Yamada | |
| 6,246,384 B1 | 6/2001 | Sano | |
| 6,251,712 B1 | 6/2001 | Tanaka et al. | |
| 6,255,705 B1 | 7/2001 | Zhang et al. | |
| 6,268,071 B1 | 7/2001 | Yasukawa et al. | |
| 6,268,631 B1 | 7/2001 | Fukada et al. | |
| 6,268,695 B1 | 7/2001 | Affinito | |
| 6,268,842 B1 | 7/2001 | Yamazaki et al. | |
| 6,274,887 B1 | 8/2001 | Yamazaki et al. | |
| 6,278,132 B1 | 8/2001 | Yamazaki et al. | |
| 6,283,578 B1 | 9/2001 | Popall et al. | |
| 6,285,039 B1 | 9/2001 | Kobori et al. | |
| 6,295,054 B1 | 9/2001 | McKnight | |
| 6,307,322 B1 * | 10/2001 | Dawson et al. | 315/169.1 |
| 6,316,810 B1 | 11/2001 | Yamazaki et al. | |
| 6,329,672 B1 * | 12/2001 | Lyu et al. | 257/59 |
| 6,337,492 B1 | 1/2002 | Jones et al. | |
| 6,355,942 B1 | 3/2002 | Yamazaki et al. | |

| | | |
|---|---|---|
| 6,359,606 B1 | 3/2002 | Yudasaka |
| 6,362,030 B1 * | 3/2002 | Nagayama et al. .......... 438/151 |
| 6,369,495 B2 | 4/2002 | Codama et al. |
| 6,373,453 B1 | 4/2002 | Yudasaka |
| 6,384,528 B1 | 5/2002 | Friend et al. |
| 6,384,818 B1 | 5/2002 | Yamazaki et al. |
| 6,392,340 B2 | 5/2002 | Yoneda et al. |
| 6,407,431 B2 | 6/2002 | Yamazaki et al. |
| 6,413,645 B1 | 7/2002 | Graff et al. |
| 6,417,898 B1 | 7/2002 | Izumi |
| 6,426,517 B2 | 7/2002 | Hayakawa et al. |
| 6,429,059 B2 | 8/2002 | Yamazaki et al. |
| 6,441,399 B1 * | 8/2002 | Koyama et al. ............... 257/59 |
| 6,441,468 B1 | 8/2002 | Yamazaki |
| 6,445,059 B1 | 9/2002 | Yamazaki |
| 6,447,867 B1 | 9/2002 | Kominami et al. |
| 6,448,580 B1 | 9/2002 | Arai et al. |
| 6,462,722 B1 | 10/2002 | Kimura et al. |
| 6,512,504 B1 | 1/2003 | Yamauchi et al. |
| 6,522,315 B2 | 2/2003 | Ozawa et al. |
| 6,529,178 B1 | 3/2003 | Kimura |
| 6,531,713 B1 | 3/2003 | Yamazaki |
| 6,542,137 B2 | 4/2003 | Kimura et al. |
| 6,573,564 B2 | 6/2003 | Yamazaki et al. |
| 6,580,214 B2 | 6/2003 | Yoneda et al. |
| 6,605,826 B2 | 8/2003 | Yamazaki et al. |
| 6,617,644 B1 | 9/2003 | Yamazaki et al. |
| 6,636,194 B2 | 10/2003 | Ishii |
| 6,642,989 B2 | 11/2003 | Umehara et al. |
| 6,674,136 B1 | 1/2004 | Ohtani |
| 6,703,643 B2 | 3/2004 | Yamazaki et al. |
| 6,730,966 B2 | 5/2004 | Koyama |
| 6,737,176 B1 | 5/2004 | Otsuki et al. |
| 6,758,538 B2 | 7/2004 | Fujita et al. |
| 6,770,502 B2 | 8/2004 | Cok et al. |
| 6,770,936 B2 | 8/2004 | Inoue et al. |
| 6,777,763 B2 | 8/2004 | Zhang et al. |
| 6,794,675 B1 | 9/2004 | Suzuki et al. |
| 6,839,045 B2 | 1/2005 | Ozawa et al. |
| 6,853,083 B1 | 2/2005 | Yamauchi et al. |
| 6,862,011 B2 | 3/2005 | Kimura et al. |
| 6,863,961 B2 | 3/2005 | Miyashita et al. |
| 6,940,214 B1 | 9/2005 | Komiya et al. |
| 6,965,195 B2 | 11/2005 | Yamazaki et al. |
| 6,977,394 B2 | 12/2005 | Yamazaki et al. |
| 6,992,435 B2 | 1/2006 | Yamauchi et al. |
| 7,083,866 B2 | 8/2006 | Otsuki et al. |
| 7,112,462 B2 | 9/2006 | Arai et al. |
| 7,113,154 B1 | 9/2006 | Inukai |
| 7,126,161 B2 | 10/2006 | Yamazaki |
| 7,288,420 B1 | 10/2007 | Yamazaki et al. |
| 7,476,900 B2 | 1/2009 | Yamauchi et al. |
| 2001/0000627 A1 | 5/2001 | Hayakawa et al. |
| 2001/0019859 A1 | 9/2001 | Yamazaki et al. |
| 2001/0049163 A1 | 12/2001 | Yamazaki et al. |
| 2002/0024493 A1 | 2/2002 | Ozawa et al. |
| 2002/0056844 A1 | 5/2002 | Yamazaki et al. |
| 2002/0075207 A1 | 6/2002 | Yudasaka |
| 2002/0089497 A1 | 7/2002 | Yudasaka |
| 2002/0097213 A1 | 7/2002 | Ozawa et al. |
| 2002/0125817 A1 | 9/2002 | Yamazaki et al. |
| 2002/0130363 A1 | 9/2002 | Yamazaki et al. |
| 2002/0185967 A1 * | 12/2002 | Friend ........................ 313/504 |
| 2002/0196206 A1 | 12/2002 | Kimura et al. |
| 2003/0054186 A1 | 3/2003 | Miyashita et al. |
| 2003/0071771 A1 | 4/2003 | Kimura |
| 2003/0098827 A1 | 5/2003 | Ozawa |
| 2003/0132900 A1 | 7/2003 | Yamauchi et al. |
| 2003/0151582 A1 | 8/2003 | Ishii |
| 2003/0155573 A1 | 8/2003 | Yamazaki et al. |
| 2003/0206144 A1 | 11/2003 | Yudasaka |
| 2003/0231273 A1 | 12/2003 | Kimura et al. |
| 2004/0065902 A1 | 4/2004 | Yamazaki et al. |
| 2004/0141139 A1 | 7/2004 | Yamazaki et al. |
| 2004/0150591 A1 | 8/2004 | Ozawa et al. |
| 2004/0196220 A1 | 10/2004 | Kimura et al. |
| 2005/0073242 A1 | 4/2005 | Yamauchi et al. |
| 2005/0156174 A1 | 7/2005 | Murakami et al. |
| 2005/0161672 A1 | 7/2005 | Yamazaki et al. |
| 2005/0197031 A1 | 9/2005 | Yamazaki et al. |
| 2006/0097256 A1 | 5/2006 | Yamazaki et al. |
| 2006/0192205 A1 | 8/2006 | Yamazaki et al. |
| 2006/0279491 A1 | 12/2006 | Ozawa et al. |
| 2007/0012921 A1 | 1/2007 | Yamazaki |
| 2008/0036699 A1 | 2/2008 | Yudasaka |

FOREIGN PATENT DOCUMENTS

| | | |
|---|---|---|
| EP | 0709718 | 5/1996 |
| EP | 0 717 445 | 6/1996 |
| EP | 0 776 147 | 5/1997 |
| EP | 0 781 075 | 6/1997 |
| EP | 859539 A2 | 8/1998 |
| EP | 0 895 219 A1 | 2/1999 |
| EP | 0 917 127 A1 | 5/1999 |
| EP | 0 940 796 A1 | 9/1999 |
| EP | 0942407 A1 | 9/1999 |
| EP | 961525 A1 | 12/1999 |
| EP | 0 999 595 A2 | 5/2000 |
| EP | 1 001 467 A2 | 5/2000 |
| EP | 1 033 755 A2 | 9/2000 |
| EP | 1 049 176 A2 | 11/2000 |
| EP | 1052701 A2 | 11/2000 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 524 696 A2 | 4/2005 |
| JP | 62-090 260 | 4/1987 |
| JP | 63-131494 | 6/1988 |
| JP | 04-350627 | 12/1992 |
| JP | 05-036475 A | 2/1993 |
| JP | 05-080712 | 4/1993 |
| JP | 05-095115 | 4/1993 |
| JP | 05-116 297 | 5/1993 |
| JP | 06-102530 | 4/1994 |
| JP | 06-186578 | 7/1994 |
| JP | 06-265940 | 9/1994 |
| JP | 07-014678 | 1/1995 |
| JP | 07-130 652 | 5/1995 |
| JP | 07-169567 | 7/1995 |
| JP | 08-078 159 | 3/1996 |
| JP | 08-075908 | 3/1996 |
| JP | 08-220560 | 8/1996 |
| JP | 08-241 048 | 9/1996 |
| JP | 08-290 647 | 11/1996 |
| JP | 08-330 602 | 12/1996 |
| JP | 08-330600 | 12/1996 |
| JP | 09-045930 | 2/1997 |
| JP | 09-148 066 | 6/1997 |
| JP | 09-166788 | 6/1997 |
| JP | 09-293879 | 11/1997 |
| JP | 10-012 377 | 1/1998 |
| JP | 10-012377 | 1/1998 |
| JP | 10-041067 | 2/1998 |
| JP | 10-082994 | 3/1998 |
| JP | 10-092 576 | 4/1998 |
| JP | 10-092576 | 4/1998 |
| JP | 10-125463 | 5/1998 |
| JP | H10-125463 | 5/1998 |
| JP | 10-189 252 | 7/1998 |
| JP | 10-189998 | 7/1998 |
| JP | 10-233283 | 9/1998 |
| JP | 10-254383 A | 9/1998 |
| JP | 10-270 363 | 10/1998 |

| | | |
|---|---|---|
| JP | 10-275682 | 10/1998 |
| JP | 10-319872 | 12/1998 |
| JP | 11-026156 | 1/1999 |
| JP | 11-054268 | 2/1999 |
| JP | 11-065487 | 3/1999 |
| JP | 11-097705 | 4/1999 |
| JP | 11-103067 | 4/1999 |
| JP | 11-112001 | 4/1999 |
| JP | 11-272235 | 10/1999 |
| JP | 2000-077191 | 3/2000 |
| JP | 2000-148046 | 5/2000 |
| JP | 2000-223279 | 8/2000 |
| JP | 2000-340798 | 12/2000 |
| JP | 2001-35659 | 2/2001 |
| JP | 2002-149112 | 5/2002 |
| WO | WO98/13811 | 4/1998 |
| WO | WO-98/36405 | 8/1998 |
| WO | WO-98/36406 | 8/1998 |
| WO | WO-1998/036407 | 8/1998 |
| WO | WO 99/02277 | 1/1999 |
| WO | WO99/12394 | 3/1999 |

OTHER PUBLICATIONS

Specification, Claims and Drawings of U.S. Appl. No. 11/079,840, filed Mar. 14, 2005.
Office Action dated Apr. 6, 2006 for European Application No. 00 112 035.1-1235.
Office Action issued in counterpart European Application No. 05010071.8-1235 dated May 14, 2007.
Search Report issued in counterpart European Patent Application No. 06015168.5-1235 dated Mar. 28, 2007.
Baldo et al., "*Highly Efficient Phosphorescent Emission From Organic Electroluminescent Devices*", Letters to Nature, vol. 395, pp. 151-154, Sep. 10, 1998.
Baldo et al., "*Very High Efficiency Green Organic Light-Emitting Devices Based on Electrophosphorescence*", Applied Physics Letters, vol. 75, No. 1, pp. 4-6 Jul. 5, 1999.
Kido et al., "*White-Light-Emitting Organic Electroluminescent Device Using Lanthanide Complexes*", Japanese Journal of Applied Physics, vol. 35, Part 2, No. 3B, pp. L394-L396, Mar. 15, 1996.
Tsutsui et al., "*Electroluminescence in Organic Thin Films*", Photochemical Processes in Organized Molecular Systems, pp. 437-450, 1991.
Tsutsui et al., "*High Quantum Efficiency in Organic Light-Emitting Devices With Iridium-Complex As a Triplet Emissive Center*", Japanese Journal of Applied Physics, vol. 38, Part 2, No. 12B, pp. L1502-L1504, Dec. 15, 1999.
Specification & Drawings of U.S. Appl. No. 09/432,662.
Specification & Drawings of U.S. Appl. No. 09/580,485.
Specification & Drawings of U.S. Appl. No. 09/587,369.
Application No. 05010071.8; Sep. 13, 2005, European Search Report.
Choi, K. et al., "Gate-Overlapped Lightly Doped Drain Poly-Si Thin-Film Transistors for Large Area-AMLCD", IEEE Transactions on Electron Devices, Jun. 1998, vol. 45, No. 6, pp. 1272-1279.
European Search Report (Application No. 00112035.1-2203 PCT; EP 4211), dated: Sep. 19, 2005.
Pending Claims (as of Dec. 27, 2007) of U.S. Appl. No. 10/678,299 filed Oct. 6, 2003; Inventors: Shunpei Yamazaki et al.
Pending Claims (As of Dec. 27, 2007) of U.S. Appl. No. 11/074,687 filed Mar. 9, 2005; Inventors: Shunpei Yamazaki et al.
Pending Claims (as of Dec. 27, 2007) of U.S. Appl. No. 11/258,933 filed Mar. 9, 2005; Inventors: Shunpei Yamazaki et al.
Office Action (European Application No. 00112035.1), dated Sep. 19, 2005.
Schenk.H et al., "Polymers for Light Emitting Diodes,", Eurodisplay '99: Proceedings of the 19th IDRC (International Display Research Conference), Sep. 6, 1999, pp. 33-37.
Shimoda.T et al., "Multicolor Pixel Patterning of Light-Emitting Polymers by Ink-Jet Printing,", SID Digest '99 : SID International Symposium Digest of Technical Papers, 1999, vol. XXX, pp. 376-379.
Kimura.M et al., "TFT-LEPD With Image Uniformity by Area Ratio Gray Scale,", Eurodisplay '99: Late-News Papers of the 19th IDRC (International Display Research Conference), Sep. 6, 1999, pp. 71-74.
Shimoda.T et al., "Technology for Active Matrix Light Emitting Polymer Displays,", IEDM 99: Technical Digest of International Electron Devices Meeting, 1999, pp. 107-110.
Search Report (Application No. 00113576.3; EP4226) Dated Apr. 11, 2006.
Office Action (U.S. Appl. No. 09/578,895; US4211) Dated Oct. 15, 2008.
Office Action (U.S. Appl. No. 10/678,299; US4211D1) Dated Jul. 18, 2008.
Pending Claims (U.S. Appl. No. 10/678,299; US4211D1 (U06688)) Dated Mar. 27, 2008.
Pending Claims (U.S. Appl. No. 11/258,933; US4211D3 (U09005)) Dated Jan. 11, 2008.
Pending Claims (U.S. Appl. No. 10/678,299; US4211D1 (U06688)) Dated Dec. 18, 2008.
Office Action (U.S. Appl. No. 10/678,299) dated Dec. 24, 2009.
Office Action (U.S. Appl. No. 11/074,687) dated Apr. 8, 2009.
Office Action (U.S. Appl. No. 11/074,687) dated Sep. 25, 2008.
Pending Claims (U.S. Appl. No. 11/074,687) dated Dec. 29, 2008.
Pending Claims (U.S. Appl. No. 10/678,299) dated May 7, 2009.
Search Report (European Application No. 00112035.1) dated Sep. 19, 2005.

* cited by examiner

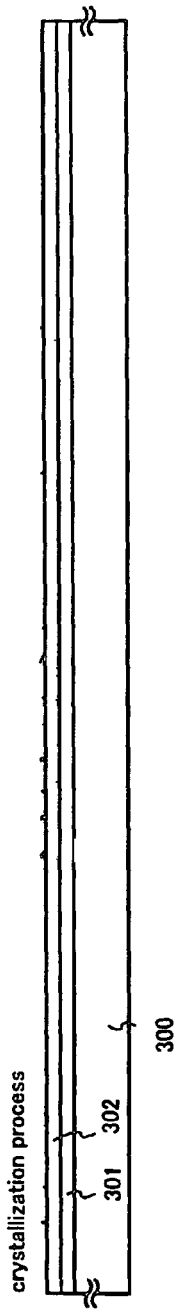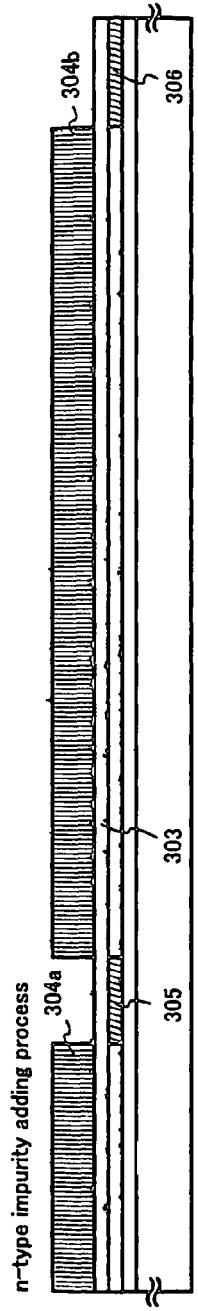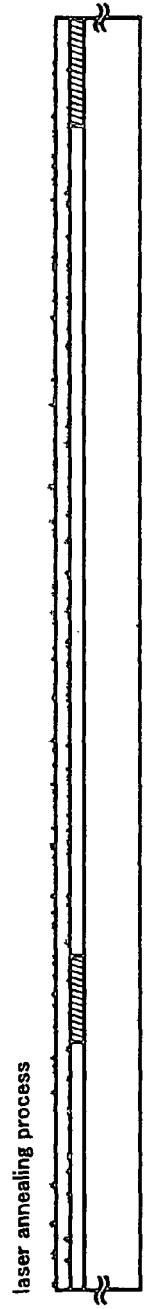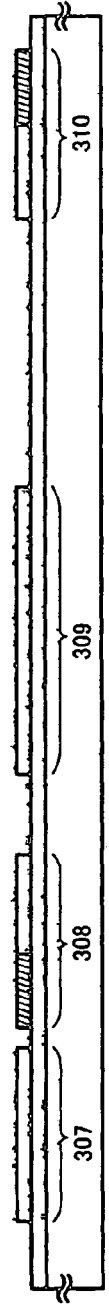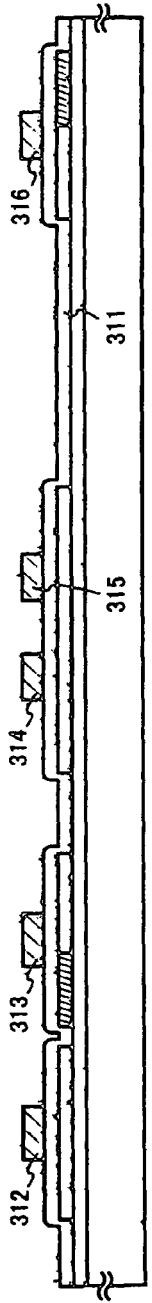

ELECTRO-OPTICAL DEVICE AND ELECTRONIC DEVICE

BACKGROUND OF THE INVENTION

1. Field of the Invention

The present invention relates to an electro-optical device, typically an EL (electroluminescence) display device formed by a semiconductor element (an element using a semiconductor thin film) made on a substrate, and to electronic equipment (an electronic device) having the electro-optical device as a display (also referred to as a display portion).

2. Description of the Related Art

Techniques of forming a TFT on a substrate have been widely progressing in recent years, and developments of applications to an active matrix type display device are advancing. In particular, a TFT using a polysilicon film has a higher electric field effect mobility (also referred to as mobility) than a TFT using a conventional amorous silicon film, and high speed operation is therefore possible. As a result, it becomes possible to perform pixel control, conventionally performed by a driver circuit external to the substrate, by a driver circuit formed on the same substrate as the pixel.

This type of active matrix display device has been in the spotlight because of the many advantage which can be obtained by incorporating various circuits and elements on the same substrate in this type of active matrix display device, such as reduced manufacturing cost, small size, increased yield, and higher throughput.

Switching elements are formed by a TFT for each of the pixels in the active matrix display device, current control is performed by driver elements using the switching elements, and an EL layer (electroluminescence layer) is made to emit light. A typical pixel structure at this time is disclosed in, for example, in FIG. 1 of U.S. Pat. No. 5,684,365 (Japanese Patent Application Laid-open No. Hei 8-234683).

As shown in FIG. 1 of the US patent, a drain of a stitching element (T1) is connected to a gate electrode of a current control element (T2), and is also connected in parallel to a capacitor (Cs). The gate voltage of the current control element (T2) is maintained by the electric charge stored in the capacitor (Cs).

Conversely, when the switching element (T1) is non-selected, the electric charge leaks through the switching element (T1) if the capacitor (Cs) is not connected (the flow of current at this point is referred to as off current), and the voltage applied to the gate electrode of the current control element (T2) becomes unable to be maintained. This is a problem which cannot be avoided because the switching element (T1) is formed by a transistor. However, the capacitor (Cs) is formed within the pixel, and therefore this becomes a factor in reducing the effective luminescence surface area (effective image display area) of the pixel.

Further, it is necessary for a large current to flow in the current control element (T2) in order to luminesce the EL layer. In other words, the performance required of the TFT becomes entirely different in the switching element and the current control element. In this type of case, it is difficult to ensure the performance required by all of the circuits and element with only one TFT structure.

SUMMARY OF THE INVENTION

In view of the above conventional technique, an object of the present invention is to provide an electro-optical device having good operation performance and high reliability, and in particular, to provide an EL display device. Another object of the present invention is to increase the quality of electronic equipment (an electronic device) having the electro-optical device as a display by increasing the image quality of the electro-optical device.

In order to achieve the above objects, the present invention assigns TFTs having an optimal structure in view of the performance required by elements contained in each pixel of the EL display device. In other words, TFTs having different structures exist within the same pixel.

Specifically, an element which places the most importance on sufficiently lowering the value of the off current (such as a switching element) is given a TFT structure in which the importance is more on reducing the off current value rather than on high speed operation. An element which places the greatest importance on current flow (such as a current control element) is given a TFT structure in which the importance is more on current flow, and on controlling deterioration due to hot carrier injection, which becomes a conspicuous problem at the same time, rather than on reducing the value of the off current.

It becomes possible to raise the operating performance of the EL display device, and to increase its reliability, with the present invention by performing proper use of TFTs on the same substrate, as above. Note that the concepts of the present invention are not limited to a pixel portion, and that the present invention is characterized by the point of being able to optimize the TFT structure contained in the pixel portion and in a driver circuit portion for driving the pixel portion.

BRIEF DESCRIPTION OF THE DRAWINGS

In the accompanying drawings:

FIGS. 3A to 3E are diagrams showing manufacturing processes of an active matrix type EL display device;

DETAILED DESCRIPTION OF THE PREFERRED EMBODIMENTS

Embodiment Mode

Figure 1:
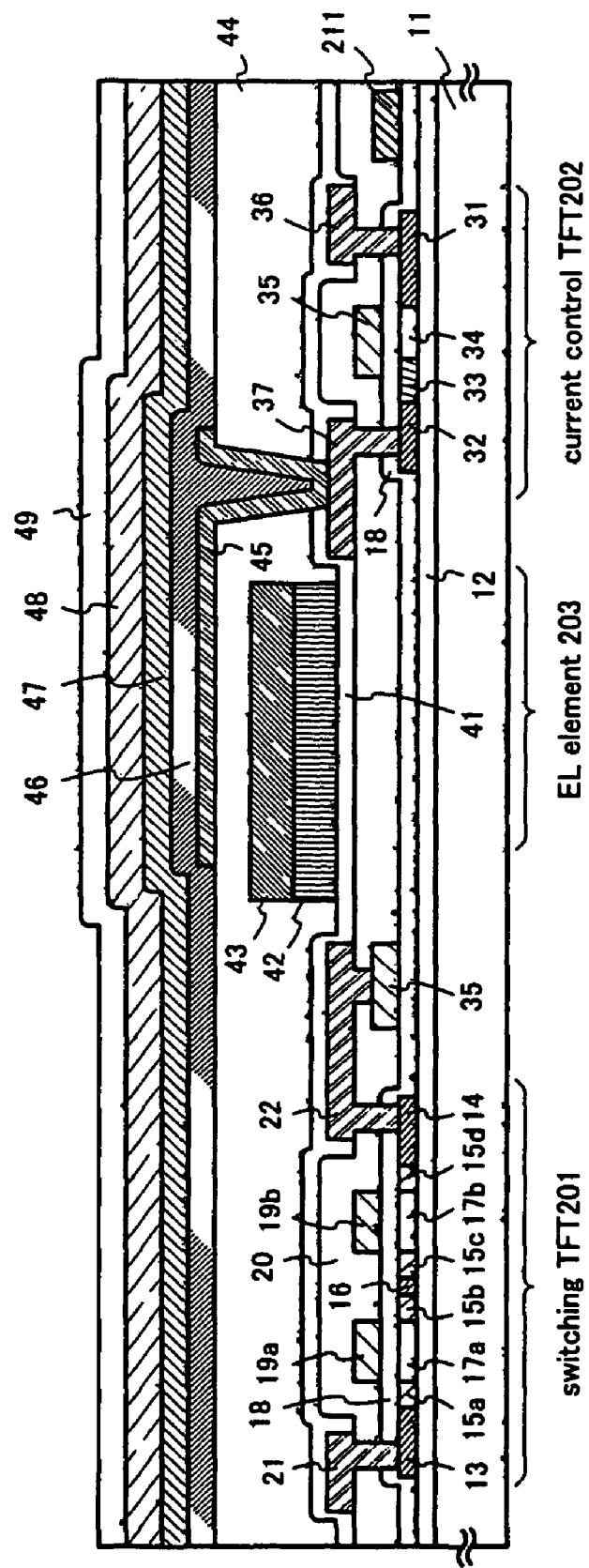
FIG. 1 is a diagram showing the cross sectional structure of the pixel portion of an EL display device.
Figure 2A:
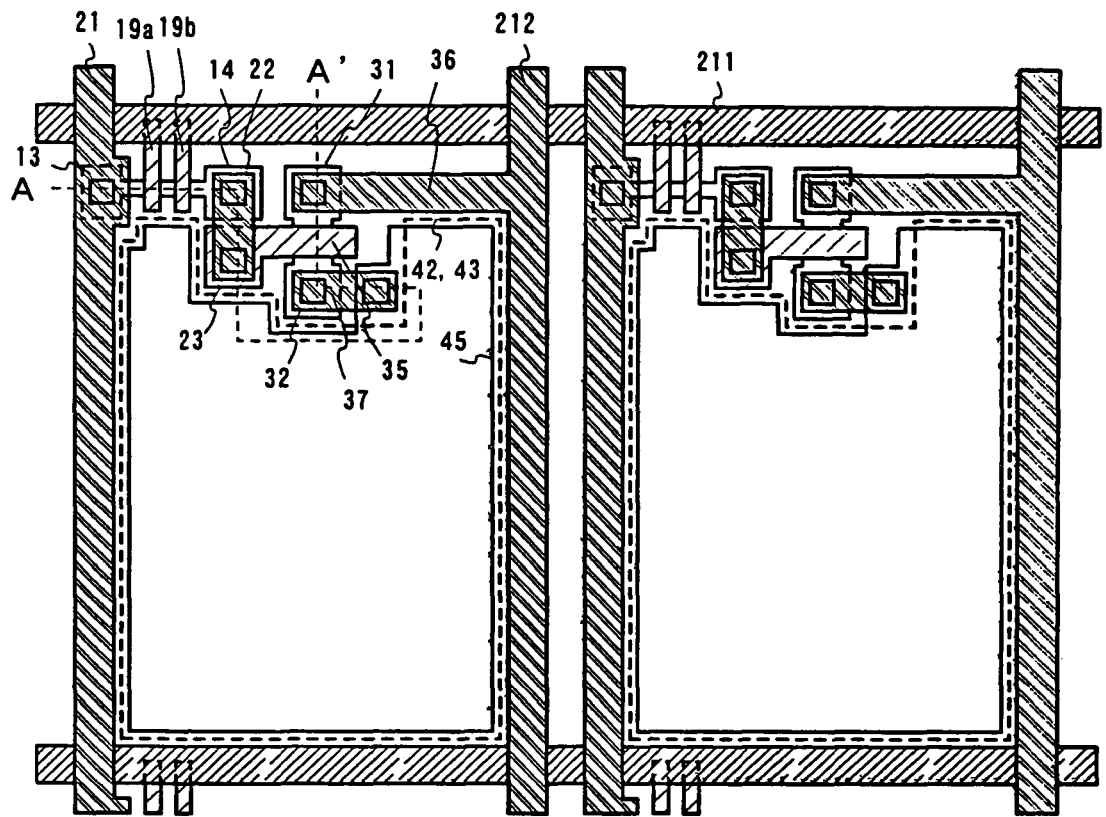
FIGS. 2A and 2B are diagrams showing the top view and the composition, respectively, of the pixel portion of an EL display device.
Figure 2B:
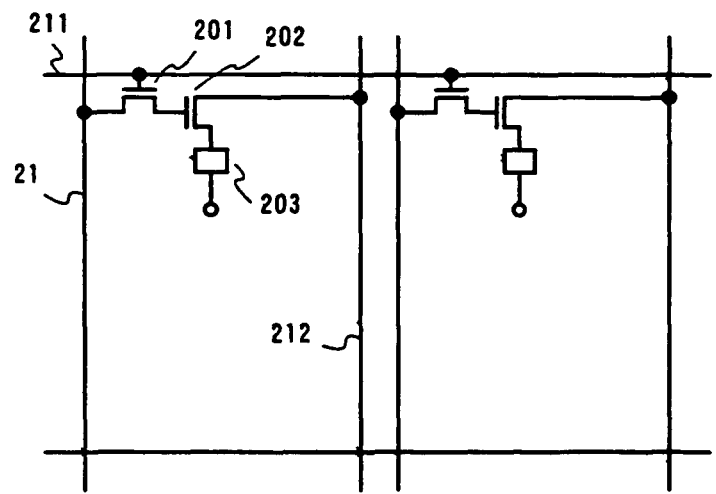

FIGS. 1 to 2B are used in explaining the preferred embodiments of the present invention. Shown in FIG. 1 is a cross sectional diagram of a pixel of an EL display device of the present invention, in FIG. 2A is its top view, and in FIG. 2B is a circuit composition. In practice, a pixel portion (image display portion) is formed with a multiple number of this type of pixel arranged in a matrix state.

Note that the cross sectional diagram of FIG. 1 shows a cross section cut along the line A-A' in the top view shown in FIG. 2A. Common symbols are used in FIG. 1 and in FIGS. 2A and 2B, and therefore the three figures may be referenced as appropriate. Furthermore, two pixels are shown in the top view of FIG. 2A, and both have the same structure.

Reference numeral 11 denotes a substrate, and reference numeral 12 denotes a base film in FIG. 1. A glass substrate, a glass ceramic substrate, a quartz substrate, a silicon substrate, a ceramic substrate, a metallic substrate, or a plastic substrate (including a plastic film) can be used as the substrate 11.

Further, the base film 12 is especially effective for cases in which a substrate containing mobile ions, or a substrate having conductivity, is used, but need not be formed for a quartz substrate. An insulating film containing silicon may be formed as the base film 12. Note that the term "insulating film containing silicon" indicates, specifically, an insulating film that contains silicon, oxygen, and nitrogen in predetermined ratios such as a silicon oxide film, a silicon nitride film, or a silicon oxynitride film (denoted by $SiO_xN_y$).

Two TFTs are formed within the pixel here. Reference numeral 201 denotes a TFT functioning as a switching element (hereafter referred to as a switching TFT), and reference numeral 202 denotes a TFT functioning as a current control element for controlling the amount of current flowing to an EL element (hereafter referred to as a current control TFT), and both are formed by an n-channel TFT.

The field effect mobility of the n-channel TFT is larger than the field effect mobility of a p-channel TFT, and therefore the operation speed is fast and electric current can flow easily. Further, even with the same amount of current flow, the n-channel TFT can be made smaller. The effective surface area of the display portion therefore becomes larger when using the n-channel TFT as a current control TFT, and this is preferable.

The p-channel TFT has the advantages that hot carrier injection essentially does not become a problem, and that the off current value is low, and there are already reports of examples of using the p-channel TFT as a switching TFT and as a current control TFT. However, by using a structure in which the position of an LDD region differs, the problems of hot carrier injection and the off current value in the n-channel TFT are solved by the present invention. The present invention is characterized by the use of n-channel TFTs for all of the TFTs within all of the pixels.

Note that it is not necessary to limit the switching TFT and the current control TFT to n-channel TFTs in the present invention, and that it is possible to use p-channel TFTs for either the switching TFT, the current control TFT, or both.

The switching TFT 201 is formed having: an active layer comprising a source region 13, a drain region 14, LDD regions 15a to 15d, a high concentration impurity region 16, and channel forming regions 17a and 17b; a gate insulating film 18; gate electrodes 19a and 19b, a first interlayer insulating film 20, a source wiring 21, and a drain wiring 22.

As shown in FIG. 2A, the present invention is characterized in that the gate electrodes 19a and 19b become a double gate structure electrically connected by a gate wiring 211 which is formed by a different material (a material having a lower resistance than the gate electrodes 19a and 19b). Of course, not only a double gate structure, but a so-called multi-gate structure (a structure containing an active layer having two or more channel forming regions connected in series), such as a triple gate structure, may also be used. The multi-gate structure is extremely effective in lowering the value of the off current, and by making the switching TFT 201 of the pixel into a multi-gate structure with the present invention, a low off current value can be realized for the switching TFT.

The active layer is formed by a semiconductor film containing a crystal structure. In other words, a single crystal semiconductor film may be used, and a polycrystal line semiconductor film or a microcrystalline semiconductor film may also be used. Further, the gate insulating film 18 may be formed by an insulating film containing silicon. Additionally, a conducting film can be used for all of the gate electrodes, the source wiring, and the drain wiring.

In addition, the LDD regions 15a to 15d in the switching TFT 201 are formed so as not to overlay with the gate electrodes 19a and 19b by interposing the gate insulating film 18. This structure is extremely effective in reducing the off current value.

Note that the formation of an offset region (a region that comprises a semiconductor layer having the same composition as the channel forming regions, and to which a gate voltage is not applied) between the channel forming regions and the LDD regions is more preferable for reducing the off current value. Further, when a multi-gate structure having two or more gate electrodes is used, the high concentration impurity region formed between the channel forming regions is effective in lowering the value of the off current.

By thus using the multi-gate structure TFT as the switching TFT 201, as above, a switching element having a sufficiently low off current value is realized by the present invention. The gate voltage of the current control element can therefore be maintained for a sufficient amount of time (for a period from one selection until the next selection) without forming a capacitor (Cs), such as the one stated in the conventional example.

Namely, it becomes possible to eliminate the capacitor which causes a reduction in the effective luminescence surface area, and it becomes possible to increase the effective luminescence surface area. This means that the image quality of the EL display device can be made brighter.

Next, the current control TFT 202 is formed having: an active layer comprising a source region 31, a drain region 32, an LDD region 33, and a channel forming region 34; a gate insulating film 18; a gate electrode 35; the first interlayer insulating film 20; a source wiring 36; and a drain wiring 37. Note that the gate electrode 35 has a single gate structure, but a multi-gate structure may also be used.

As shown in FIGS. 2A and 2B, the drain of the switching TFT 201 is electrically connected to the gate of the current control TFT 202. Specifically, the gate electrode 35 of the current control TFT 202 is electrically connected to the drain region 14 of the switching TFT 201 through the drain wiring (also referred to as a connection wiring) 22. Further, the source wiring 36 is connected to an electric current supply wiring 212.

Figure 8:
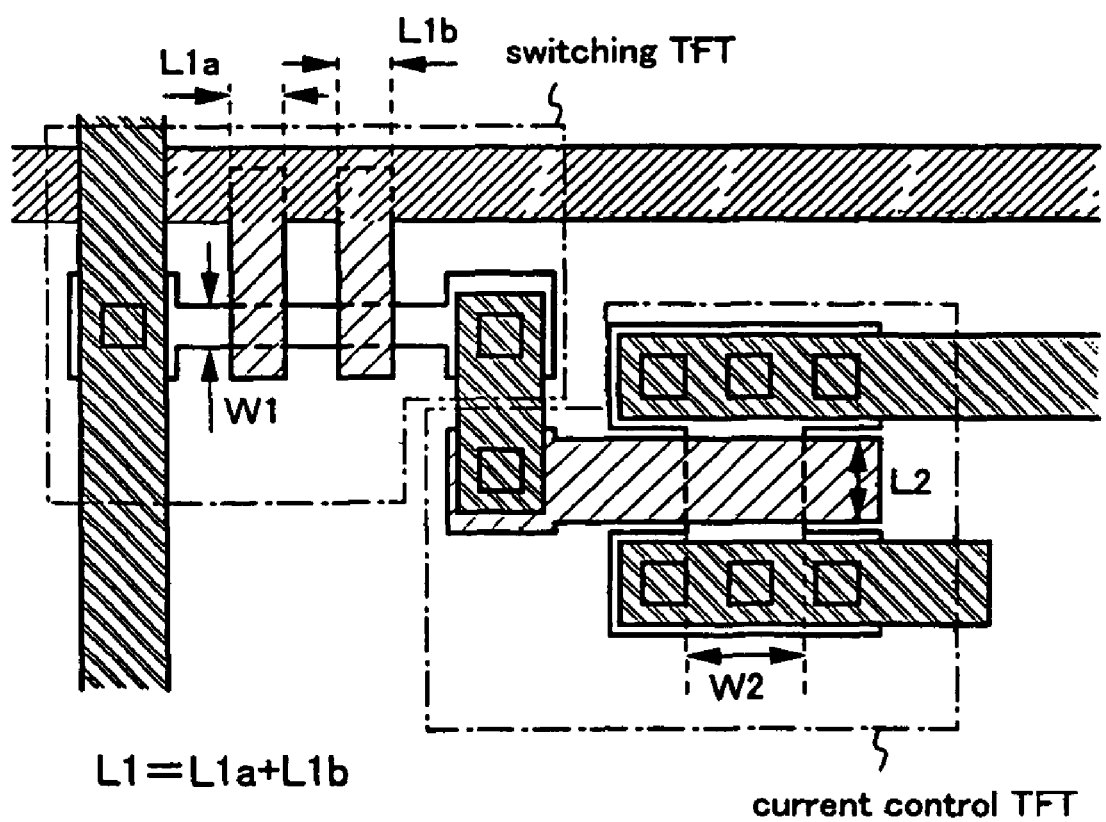
FIG. 8 is an enlarged diagram of the pixel portion of an EL display device.

A characteristic of the current control TFT 202 is that its channel width is larger than the channel width of the switching TFT 201. Namely, as shown in FIG. 8, when the channel length of the switching TFT is taken as L1 and its channel width as W1, and the channel length of the current control TFT is taken as L2 and its channel width as W2, a relational expression is reached in which $W2/L2 \geq 5 \times W1/L1$ (preferably $W2/L2 \leq 10 \times W1/L1$). Consequently, it is possible for more current to easily flow in the current control TFT than in the switching TFT.

Note that the channel length L1 of the multi-gate structure switching TFT is the sum of each of the channel lengths of the two or more channel forming regions formed. A double gate structure is formed in the case of FIG. 8, and therefore the sum of the channel lengths L1$a$ and L1$b$, respectively, of the two channel-forming regions becomes the channel length L1 of the switching TFT.

The channel lengths L1 and L2, and the channel widths W1 and W2 are not specifically limited to a range of values with the present invention, but it is preferable that W1 be from 0.1 to 5 μm (typically between 1 and 3 μm), and that W2 be from 0.5 to 30 μm (typically between 2 and 10 μm). It is preferable that L1 be from 0.2 to 18 μm (typically between 2 and 15 μm), and that L2 be from 0.1 to 50 μm (typically between 1 and 20 μm) at this time.

Note that it is preferable to set the channel length L in the current control TFT on the long side in order to prevent excessive current flow. Preferably, $W2/L2 \geq 3$ (more preferably $W2/L2 \geq 5$). It is also preferable that the current flow per pixel is from 0.5 to 2 μA (better between 1 and 1.5 μA).

By setting the numerical values within this range, all standards, from an EL display device having a VGA class number of pixels (640×480) to an EL display device having a high vision class number of pixels (1920×1080) can be included.

Furthermore, the length (width) of the LDD region formed in the switching TFT 201 is set from 0.5 to 3.5 μm, typically between 2.0 and 2.5 μm.

The EL display device shown in FIG. 1 is characterized in that the LDD region 33 is formed between the drain region 32 and the channel forming region 34 in the current control TFT 202. In addition, the LDD region 33 has both a region which overlaps, and a region which does not overlap the gate electrode 35 by interposing a gate insulating film 18.

The current control TFT 202 supplies a current for making the EL element 203 luminesce, and at the same time controls the amount supplied and makes gray scale display possible. It is therefore necessary that there is no deterioration when the current flows, and that steps are taken against deterioration due to hot carrier injection. Furthermore, when black is displayed, the current control TFT 202 is set in the off state, but if the off current value is high, then a clean black color display becomes impossible, and this invites problems such as a reduction in contrast. It is therefore necessary to suppress the value of the off current.

Regarding deterioration due to hot carrier injection, it is known that a structure in which the LDD region overlaps the gate electrode is extremely effective. However, if the entire LDD region is made to overlap the gate electrode, then the value of the off current rises, and therefore the applicant of the present invention resolves both the hot carrier and off current value countermeasures at the same time by a novel structure in which an LDD region which does not overlap the gate electrode is formed in series.

The length of the LDD region which overlaps the gate electrode may be made from 0.1 to 3 μm (preferable between 0.3 and 1.5 μm) at this point. If it is too long, then the parasitic capacitance will become larger, and if it is too short, then the effect of preventing hot carrier will become weakened. Further, the length of the LDD region not overlapping the gate electrode may be set from 1.0 to 3.5 μm (preferable between 1.5 and 2.0 μm). If it is too long, then a sufficient current becomes unable to flow, and if it is too short, then the effect of reducing off current value becomes weakened.

A parasitic capacitance is formed in the above structure in the region where the gate electrode and the LDD region overlap, and therefore it is preferable that this region not be formed between the source region 31 and the channel forming region 34. The carrier (electrons in this case) flow direction is always the same for the current control TFT, and therefore it is sufficient to form the LDD region on only the drain region side.

Further, looking from the viewpoint of increasing the amount of current that is able to flow, it is effective to make the film thickness of the active layer (especially the channel forming region) of the current control TFT 202 thick (preferably from 50 to 100 nm, more preferably between 60 and 80 nm). Conversely, looking from the point of view of making the off current value smaller for the switching TFT 201, it is effective to make the film thickness of the active layer (especially the channel forming region) thin (preferably from 20 to 50 nm, more preferably between 25 and 40 nm).

Next, reference numeral 41 denotes a first passivation film, and its film thickness may be set from 10 nm to 1 μm (preferably between 200 and 500 nm). An insulating film containing silicon (in particular, preferably a silicon oxynitride film or a silicon nitride film) can be used as the passivation film material. The passivation film 41 plays the role of protecting the manufactured TFT from contaminant matter and moisture. Alkaline metals such as sodium are contained in an EL layer formed on the final TFT. In other words, the first passivation film 41 works as a protecting layer so that these alkaline metals (mobile ions) do not penetrate into the TFT. Note that alkaline metals and alkaline-earth metals are contained in the term 'alalkaline metal' throughout this specification.

Further, by making the passivation film 41 possess a heat radiation effect, it is also effective in preventing thermal degradation of the EL layer. Note that light is emitted from the base 11 side in the FIG. 1 structure of the EL display device, and therefore it is necessary for the passivation film 41 to have light transmitting characteristics.

A chemical compound containing at least one element selected from the group consisting of B (boron), C (carbon), and N (nitrogen), and at least one element selected from the group consisting of Al (aluminum), Si (silicon), and P (phosphorous) can be given as a light transparent material possessing heat radiation qualities. For example, it is possible to use: an aluminum nitride compound, typically aluminum nitride ($Al_xN_y$); a silicon carbide compound, typically silicon carbide ($Si_xC_y$); a silicon nitride compound, typically silicon nitride ($Si_xN_y$); a boron nitride compound, typically boron nitride ($B_xN_y$); or a boron phosphate compound, typically boron phosphate ($B_xP_y$). Further, an aluminum oxide compound, typically aluminum oxide ($Al_xO_y$), has superior light transparency characteristics, and has a thermal conductivity of 20 Wm$^{-1}$K$^{-1}$, and can be said to be a preferable material. These materials not only possess heat radiation qualities, but also are effective in preventing the penetration of substances such as moisture and alkaline metals. Note that x and y are arbitrary integers for the above transparent materials.

The above chemical compounds can also be combined with another element. For example, it is possible to use nitrated aluminum oxide, denoted by $AlN_xO_y$, in which nitrogen is added to aluminum oxide. This material also not only possesses heat radiation qualities, but also is effective in preventing the penetration of substances such as moisture and alkaline metals. Note that x and y are arbitrary integers for the above nitrated aluminum oxide.

Furthermore, the materials recorded in Japanese Patent Application Laid-open No. Sho 62-90260 can also be used. Namely, a chemical compound containing Si, Al, N, O, and M can also be-used (note that M is a rare-earth element, preferably an element selected from the group consisting of Ce (cesium), Yb (ytterbium), Sm (samarium), Er (erbium), Y (yttrium), La (lanthanum), Gd (gadolinium), Dy (dysprosium), and Nd (neodymium)). These materials not only possess heat radiation qualities, but also are effective in preventing the penetration of substances such as moisture and alkaline metals.

Furthermore, carbon films such as a diamond thin film or amorphous carbons (especially those which have characteristics close to those of diamond; referred to as diamond-like carbon) can also be used. These have very high thermal conductivities, and are extremely effective as radiation layers. Note that if the film thickness becomes larger, there is brown banding and the transmissivity is reduced, and therefore it is preferable to use as thin a film thickness (preferably between 5 and 100 nm) as possible.

Note that the aim of the first passivation film 41 is in protecting the TFT from contaminating matter and from moisture, and therefore it must made so as to not lose this effect. A thin film made from a material possessing the above radiation effect can be used by itself, but it is effective to laminate this thin film and a thin film having shielding properties against alkaline metals and moisture (typically a silicon nitride film ($Si_xN_y$) or a silicon oxynitride film ($SiO_xN_y$)). Note that x and y are arbitrary integers for the above silicon nitride films and silicon oxynitride films.

Reference numeral 42 denotes a color filter, and reference numeral 43 denotes a fluorescent substance (also referred to as a fluorescent pigment layer). Both are a combination of the same color, and contain red (R), green (G), or blue (B). The color filter 42 is formed in order to increase the color purity, and the fluorescent substance 43 is formed in order to perform color transformation.

Note that EL display devices are roughly divided into four types of color displays: a method of forming three types of EL elements corresponding to R, G, and B; a method of combining white color luminescing EL elements with color filters; a method of combining blue or blue-green luminescing EL elements and fluorescent matter (fluorescing color change layer, CCM); and a method of using a transparent electrode as a cathode (opposing electrode) and overlapping EL elements corresponding to R, G, and B.

The structure of FIG. 1 is an example of a case of using a combination of blue luminescing EL elements and a fluorescent substance. A blue color emitting luminescence layer is used as the EL element 203 here, light possessing blue color region wavelength, including ultraviolet light, is formed, and the fluorescent substance 43 is activated by the light, and made to emit red, green, or blue light. The color purity of the light is increased by the color filter 42, and this is outputted.

Note that it is possible to implement the present invention without being concerned with the method of luminescence, and that all four of the above methods can be used with the present invention.

Furthermore, after forming the color filter 42 and the fluorescent substance 43, leveling is performed by a second interlayer insulating film 44. A resin film is preferable as the second interlayer insulating film 44, and one such as polyimide, polyamide, acrylic, or BCB (benzocyclobutane) may be used. An inorganic film may, of course, also be used, provided that sufficient leveling is possible.

The leveling of steps due to the TFT by the second interlayer insulating film 44 is extremely important. The EL layer formed afterward is very thin and therefore there are cases in which poor luminescence is caused by the existence of a step. It is therefore preferable to perform leveling before forming a pixel electrode so as to be able to form the EL layer on as level a surface as possible.

Furthermore, it is effective to form an insulating film having a high thermal radiation effect (hereafter referred to as a thermal radiation layer) on the second interlayer insulating film 44. A film thickness of 5 nm to 1 μm (typically between 20 and 300 nm) is preferable. This type of thermal radiation layer functions so that the heat generated by the EL element is released, so that heat is not stored in the EL element. Further, when formed by a resin film, the second interlayer insulating film 44 is weak with respect to heat, and the thermal radiation layer works so as not to impart bad influence due to the heat generated by the EL element.

It is effective to perform leveling of the TFT by the resin film in manufacturing the EL display device, as stated above, but there has not been a conventional structure which considers the deterioration of the resin film due to heat generated by the EL element. It can therefore be said that the formation of the thermal radiation layer is extremely effective in resolving this point.

Furthermore, provided that a material which is not permeable to moisture, oxygen, or alkaline metals (a material similar to that of the first passivation film 41) is used as the thermal radiation layer, then it can also function as a protecting layer in order that alkaline metals within the EL layer do not diffuse toward the TFT, at the same time as preventing deterioration of the EL element and the resin film due to heat, as above. In addition, the thermal radiation layer also functions as a protecting layer so that moisture and oxygen do not penetrate into the EL layer from the TFT.

In particular, provided that the thermal radiation effect is desired, a carbon film such as a diamond film or a diamond-like carbon film is preferable, and in order to prevent penetration of substances such as moisture, it is more preferable to use a lamination structure of a carbon film and a silicon nitride film (or a silicon oxynitride film).

A structure in which TFT side and EL element side are segregated by an insulating film which has a high radiation effect and is capable of shielding moisture and alkaline metal, is thus effective.

Reference numeral 45 denotes a pixel electrode (EL element anode) made from a transparent conducting film. After opening a contact hole in the second interlayer insulating film 44 and in the first passivation film 41, the pixel electrode 45 is formed so as to be connected to the drain wiring 37 of the current control TFT 202.

An EL layer (an organic material is preferable) 46, a cathode 47, and a protecting electrode 48 are formed in order on the pixel electrode 45. A single layer structure or a lamination structure can be used as the EL layer 46, but there are many cases in which the lamination structure is used. Various lamination structures have been proposed, combinations of layers such as a luminescence layer, an electron transporting layer, an electron injecting layer, a hole injecting layer, and a hole transporting layer, but any structure may be used for the present invention. Doping of a fluorescent pigment into the EL layer may also be performed, of course. Note that a luminescing element formed by a pixel electrode (anode), an EL layer, and a cathode is referred to as an EL element throughout this specification.

All already known EL materials can be used by the present invention. Organic materials are widely known as such materials, and considering the driver voltage, it is preferable to use an organic material. For example, the materials disclosed in the following U.S. patents and Japanese patent applications can be used as the organic EL material:

U.S. Pat. Nos. 4,356,429; 4,539,507; 4,720,432; 4,769,292; 4,885,211; 4,950,950; 5,059,861; 5,047,687; 5,073,446; 5,059,862; 5,061,617; 5,151,629; 5,294,869; 5,294,870; Japanese Patent Application Laid-open No. Hei 10-189525; Japanese Patent Application Laid-open No. Hei 8-241048; and Japanese Patent Application Laid-open No. Hei 8-78159.

Specifically, an organic material such as the one shown by the following general formula can be used as a hole injecting layer.

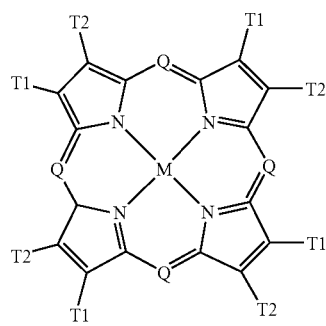

[formula 1]

Here, Q is either N or a C—R (carbon chain); M is a metal, a metal oxide, or a metal halide; R is hydrogen, an alkyl, an aralkyl, an aryl, or an alkalyl; and T1 and T2 are unsaturated six member rings including substituent such as hydrogen, alkyl, or halogen.

Furthermore, an aromatic tertiary amine can be used as an organic material hole transporting layer, preferably including the tetraaryldiamine shown by the following general formula.

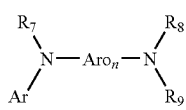

[formula 2]

In formula 2 Are is an arylene group, n is an integer from 1 to 4, and Ar, $R_7$, $R_8$, and $R_9$ are each various chosen aryl groups.

In addition, a metal oxynoid compound can be used as an organic material EL layer, electron transporting layer, or electron injecting layer. A material such as that shown by the general formula below may be used as the metal oxinoid compound.

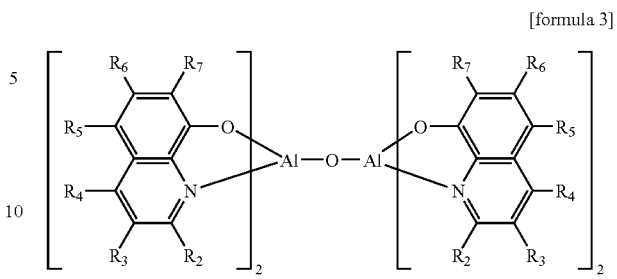

[formula 3]

It is possible to substitute $R_2$ through $R_7$, and a metal oxinoid such as the following can also be used.

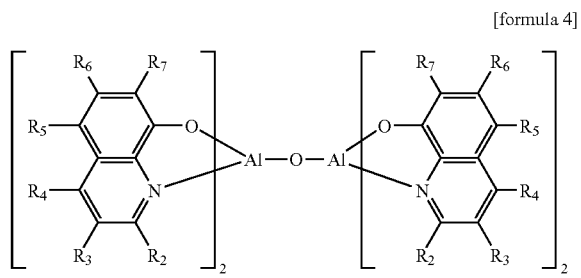

[formula 4]

In formula 4, $R_2$ through $R_7$ are defined as stated above; $L_1$ through $L_5$ are carbohydrate groups containing from 1 to 12 carbon elements; and both $L_1$ and $L_2$, or both $L_2$ and $L_3$ are formed by benzo-rings. Further, a metal oxinoid such as the following may also be used.

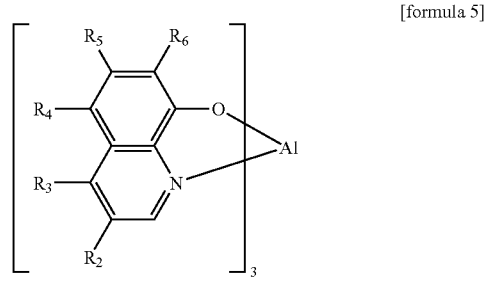

[formula 5]

It is possible to substitute $R_2$ through $R_6$ here. Coordination compounds having organic ligands are thus included as organic EL materials. Note that the above examples are only some examples of organic EL materials which can be used as the EL material of the present invention, and that there is absolutely no need to limit the EL material to these.

Furthermore, when using an ink jet method for forming the EL layer, it is preferable to use a polymer material as the EL material. Polymer materials such as the following can be given as typical polymer materials: polyparaphenylene vinylenes (PPVs); and polyfluorenes. For colorization, it is preferable to use, for example, a cyano-polyphenylene vinylene in a red luminescing material; a polyphenylene vinylene in a green luminescing material; and a polyphenylene vinylene and a polyalkylphenylene in a blue luminescing material. Regarding organic EL materials which can be used in an ink-jet method, all of the materials recorded in Japanese Patent Application Laid-open No. Hei 10-012377 can be cited.

Furthermore, a material containing a low work coefficient material such as magnesium (Mg), lithium (Li), cesium (Cs), barium (Ba), potassium (K), beryllium (Be), or calcium (Ca) is used as the cathode 47. Preferably, an electrode made from MgAg (a material made from Mg and Ag at a mixture of Mg:Ag=10:1) may be used. In addition, a MgAgAl electrode, a LiAl electrode, and a LiFAl electrode can be given as other examples. Further, the protecting electrode 48 is an electrode formed in order to be a protecting film against moisture from external to the cathode 47, and a material containing aluminum (Al) or silver (Ag) is used. The protecting electrode 48 also has a heat radiation effect.

Note that it is desirable to form the EL layer 46 and the cathode 47 in succession, without exposure to the atmosphere. In other words, no matter what type of lamination structure the EL layer and the cathode contain, it is preferable to form everything in a multi-chamber (also referred to as a cluster tool) type deposition device in succession. This is in order to avoid the absorption of moisture when the EL layer is exposed to the atmosphere because if an organic material is used as the EL layer, then it is extremely weak with respect to moisture. In addition, not only the EL layer 46 and the cathode 47, it is even better to form all the way through the protecting electrode 48 in succession.

The EL layer is extremely weak with respect to heat, and therefore it is preferable to use vacuum evaporation (in particular, an organic molecular beam evaporation method is effective in that it forms a very thin film, on the molecular order level), sputtering, plasma CVD, spin coating, screen printing, or ion plating as the film deposition method. It is also possible to form the EL layer by an ink-jet method. For the ink jet method there is a bubble jet method using cavitation (refer to Japanese Patent Application Laid-open No. Hei 5-116297), and there is a piezo method using a piezo element (refer to Japanese Patent Application Laid-open No. Hei 8-290647), and in view of the fact that organic EL materials are weak with respect to heat, the piezo method is preferable.

Reference numeral 49 denotes a second passivation film, and its film thickness may be set from 10 nm to 1 μm (preferable between 200 and 500 nm). The object of forming the second passivation film 49 is mainly to protect the EL layer 46 from moisture, but it is also good if the second passivation film 49 is made to possess a heat radiation effect, similar to the first passivation film 41. The same materials as used for the first passivation film 41 can therefore be used as the formation material of the second passivation film 49. Note that when an organic material is used as the EL layer 46, it deteriorates due to bonding with oxygen, and therefore it is preferable to use an insulating film which does not easily emit oxygen.

Further, the EL layer is weak with respect to heat, as stated above, and therefore it is preferable to perform film deposition at a low temperature as possible (preferably in the range from room temperature to 120° C.). It can therefore be said that plasma CVD, sputtering, vacuum evaporation, ion plating, and solution application (spin coating) are desirable film deposition methods.

The EL display device of the present invention has a pixel portion containing a pixel with a structure as stated above, and TFTs having differing structures in response to their function are arranged in the pixel. A switching TFT having a sufficiently low off current value, and a current control TFT which is strong with respect to hot carrier injection can be formed within the same pixel, and an EL display device having high reliability and which is capable of good image display can thus be formed.

Note that the most important point in the pixel structure of FIG. 1 is that a multi-gate structure TFT is used as the switching TFT, and that it is not necessary to place limits on the structure of FIG. 1 with regard to such things as the placement of LDD regions.

A more detailed explanation of the present invention, having the above constitution, is now performed by the embodiments shown below.

Embodiment 1

The embodiments of the present invention are explained using FIGS. 3A to 5C. A method of manufacturing a pixel portion, and TFTs of a driver circuit portion formed in the periphery of the pixel portion, is explained here. Note that in order to simplify the explanation, a CMOS circuit is shown as a basic circuit for the driver circuits.

First, as shown in FIG. 3A, a base film 301 is formed with a 300 nm thickness on a glass substrate 300. Silicon oxynitride films are laminated as the base film 301 in embodiment 1. It is good to set the nitrogen concentration to between 10 and 25 wt % in the film contacting the glass substrate 300.

Further, it is effective to form a heat radiating layer, made from the same material as that of the first passivation film 41 shown in FIG. 1, as a portion of the base film 301. A large electric current flows in a current control TFT heat is easily generated, and therefore it is effective to form the heat radiating layer as close as possible to the current control TFT.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known method, forming a crystalline silicon film (also referred to as a polycrystal line silicon film or a polysilicon film) 302. Thermal crystallization using an electric furnace, laser annealing crystallization using a laser, and lamp annealing crystallization using an infrared lamp exist as known crystallization methods. Crystallization is performed in embodiment 1 using light from an excimer laser which uses XeCl gas.

Note that pulse emission type excimer laser light formed into a linear shape is used in embodiment 1, but a rectangular shape may also be used, and continuous emission argon laser light and continuous emission excimer laser light can also be used.

The crystalline silicon film is used as an active layer of the TFTs in embodiment 1, but it is also possible to use an amorphous silicon film as the active layer. However, it is necessary for a large current to flow through the current control TFT, and therefore it is more effective to use the crystalline silicon film, through which current easily flows.

Note that it is effective to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 3B, a protecting film 303 is formed on the crystalline silicon film 302 from a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is formed so that the crystalline silicon film is not directly exposed to plasma during addition of an impurity, and so that it is possible to have delicate concentration control of the impurity.

Resist masks 304a and 304b are then formed on the protecting film 303, and an impurity element which imparts n-type conductivity (hereafter referred to as an n-type impurity element) is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1 \times 10^{18}$ atoms/$cm^3$ in embodiment 1. An ion implantation method, in which separation of mass is performed, may also be used, of course.

The dose amount is regulated so that the n-type impurity element is contained in n-type impurity regions 305 and 306, thus formed by this process, at a concentration of $2 \times 10^{16}$ to $5 \times 10^{19}$ atoms/$cm^3$ (typically between $5 \times 10^{17}$ and $5 \times 10^{18}$ atoms/$cm^3$).

Next, as shown in FIG. 3C, the protecting film 303 is removed, and activation of the added periodic table group 15 element is performed. A known technique of activation may be used as the means of activation, and activation is done in embodiment 1 by irradiation of excimer laser light. Both of pulse emission type laser and a continuous emission type laser may be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protecting film 303 in place.

Activation by heat treatment may also be performed along with activation of the impurity element by laser light. When activation is performed by heat treatment, considering the heat resistance of the substrate, it is good to perform heat treatment on the order of 450 to 550° C.

A boundary portion (connecting portion) with regions along the edges of the n-type impurity regions 305 and 306, namely regions along the perimeter into which the n-type impurity element, which exists in the n-type impurity regions 305 and 306, is not added, is delineated by this process. This means that, at the point when the TFTs are later completed, extremely good connections can be formed between LDD regions and channel forming regions.

Unnecessary portions of the crystalline silicon film are removed next, as shown in FIG. 3D, and island shape semiconductor films (hereafter referred to as active layers) 307 to 310 are formed.

Then, as shown in FIG. 3E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon oxynitride film is used in embodiment 1.

A conducting film with a thickness of 200 to 400 nm is formed next and patterned, forming gate electrodes 312 to 316. Note that in embodiment 1, the gate electrodes and lead wirings electrically connected to the gate electrodes (hereafter referred to as gate wirings) are formed from different materials. Specifically, a material having a lower resistance than that of the gate electrodes is used for the gate wirings. This is because a material which is capable of being microprocessed is used as the gate electrodes, and even if the gate wirings cannot be micro-processed, the material used for the wirings has low resistance. Of course, the gate electrodes and the gate wirings may also be formed from the same material.

Further, the gate wirings may be formed by a single layer conducting film, and when necessary, it is preferable to use a two layer or a three layer lamination film. All known conducting films can be used as the gate electrode material. However, as stated above, it is preferable to use a material which is capable of being micro-processed, specifically, a material which is capable of being patterned to a line width of 2 μm or less.

Typically, a film of a material chosen from among the group consisting of tantalum (Ta), titanium (Ti), molybdenum (Mo), tungsten (W), and chromium (Cr); or a nitrated compound of the above elements (typically a tantalum nitride film, a tungsten nitride film, or a titanium nitride film); or an alloy film of a combination of the above elements (typically a Mo—W alloy or a Mo—Ta alloy); or a silicide film of the above elements (typically a tungsten silicide film or a titanium silicide film); or a silicon film which has been made to possess conductivity can be used. A single layer film or a lamination may be used, of course.

A lamination film made from a 50 nm thick tantalum nitride (TaN) film and a 350 nm thick Ta film is used in embodiment 1. It is good to form this film by sputtering. Furthermore, if an inert gas such as Xe or Ne is added as a sputtering gas, then film peeling due to the stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 4A:
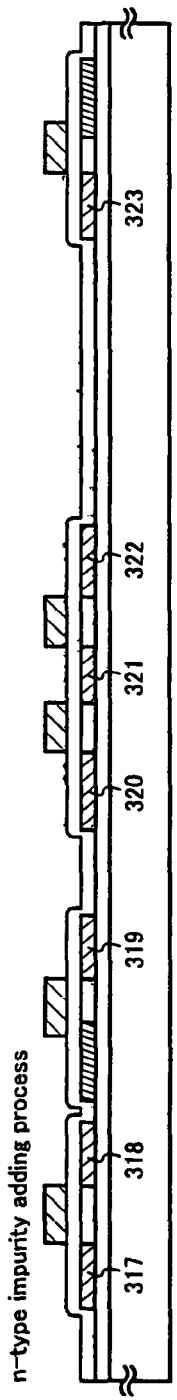
FIGS. 4A to 4D are diagrams showing manufacturing processes of an active matrix type EL display device.

Next, an n-type impurity element (phosphorous is used in embodiment 1) is added in a self-aligning manner with the gate electrodes 312 to 316 as masks, as shown in FIG. 4A. The addition is regulated so that phosphorous is added to impurity regions 317 to 323 thus formed at a concentration of 1/10 to 1/2 that of the impurity regions 305 and 306 (typically between 1/4 and 1/3). Specifically, a concentration of $1 \times 10^{16}$ to $5 \times 10^{18}$ atoms/$cm^3$ (typically $3 \times 10^{17}$ to $3 \times 10^{18}$ atoms/$cm^3$) is preferable.

Figure 4B:
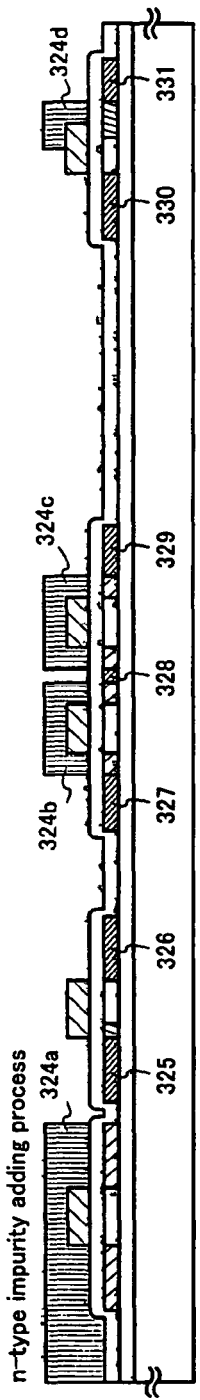

Resist masks 324a to 324d are formed next to cover the gate electrodes, as shown in FIG. 4B, and an n-type impurity element (phosphorous is used in embodiment 1) is added, forming impurity regions 325 to 331 containing a high concentration of phosphorous. Ion doping using phosphine ($PH_3$) is also performed here, and is regulated so that the phosphorous concentration of these regions is from $1 \times 10^{20}$ to $1 \times 10^{21}$ atoms/$cm^3$ (typically between $2 \times 10^{20}$ and $5 \times 10^{20}$ atoms/$cm^3$).

A source region or a drain region of the n-channel TFT is formed by this process, and in the switching TFT, a portion of the n-type impurity regions 320 to 322 formed by the process of FIG. 4A remains. These remaining regions correspond to the LDD regions 15a to 15d of the switching TFT in FIG. 1.

Figure 4C:
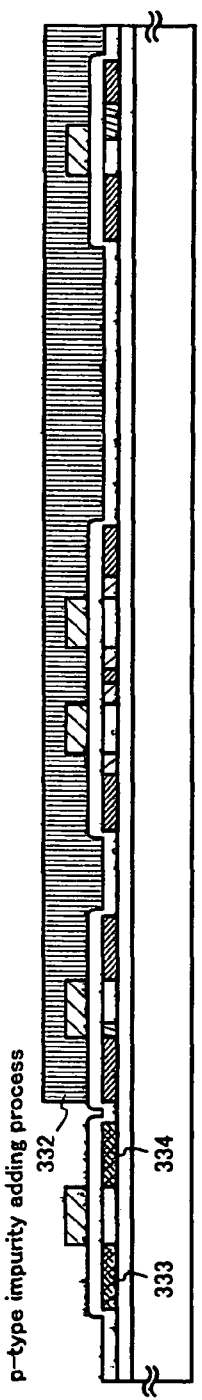
Figure 4D:
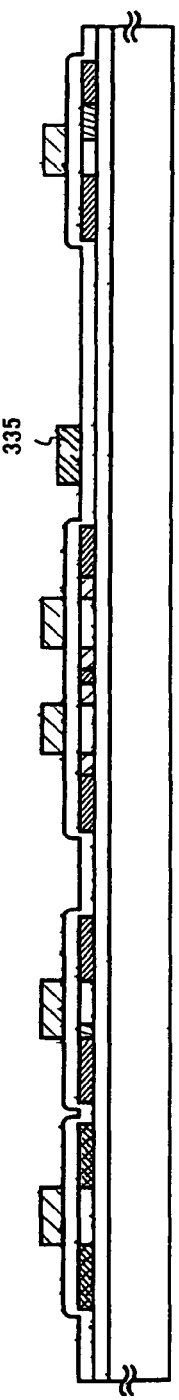

Next, as shown in FIG. 4C, the resist masks 324a to 324d are removed, and a new resist mask 332 is formed. A p-type impurity element (boron is used in embodiment 1) is then added, forming impurity regions 333 and 334 containing a high concentration of boron. Boron is added here to a concentration of $3 \times 10^{20}$ to $3 \times 10^{21}$ atoms/$cm^3$ (typically between $5 \times 10^{20}$ and $1 \times 10^{21}$ atoms/$cm^3$) by ion doping using diborane ($B_2H_6$).

Note that phosphorous has already been added to the impurity regions 333 and 334 at a concentration of $1\times10^{16}$ to $5\times10^{18}$ atoms/cm$^3$, but boron is added here at a concentration of at least 3 times that of the phosphorous. Therefore, the n-type impurity regions already formed completely invert to p-type, and function as p-type impurity regions.

Next, after removing the resist mask 332, the n-type and p-type impurity elements added at various concentrations are activated. Furnace annealing, laser annealing, or lamp annealing may be performed as a means of activation. Heat treatment is performed in embodiment 1 in a nitrogen atmosphere for 4 hours at 550° C. in an electric furnace.

It is important to remove as much of the oxygen in the atmosphere as possible at this time. This is because if any oxygen exists, then the exposed surface of the electrode oxidizes, inviting an increase in resistance, and at the same time it becomes more difficult to later make an ohmic contact. It is therefore preferable that the concentration of oxygen in the atmosphere in the above activation process be 1 ppm or less, desirably 0.1 ppm or less.

After the activation process is completed, a gate wiring 335 with a thickness of 300 nm is formed next. A metallic film having aluminum (Al) or copper (Cu) as its principal constituent (comprising 50 to 100% of the composition) may be used as the material of the gate wiring 335. As with the gate wiring 211 of FIG. 2, the gate wiring 335 is formed with a placement so that the gate electrodes 314 and 315 of the switching TFTs (corresponding to gate electrodes 19a and 19b of FIG. 2) are electrically connected. (See FIG. 4D.)

The wiring resistance of the gate wiring can be made extremely small by using this type of structure, and therefore a pixel display region (pixel portion) having a large surface area can be formed. Namely, the pixel structure of embodiment 1 is extremely effective because an EL display device having a screen size of a 10 inch diagonal or larger (in addition, a 30 inch or larger diagonal) is realized.

Figure 5A:
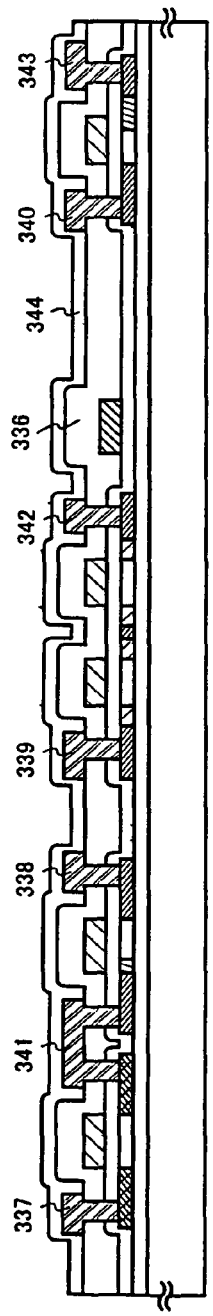
FIGS. 5A to 5C are diagrams showing manufacturing processes of an active matrix type EL display device.

A first interlayer insulating film 336 is formed next, as shown in FIG. 5A. A single layer insulating film containing silicon is used as the first interlayer insulating film 336, but a lamination film may be combined in between. Further, a film thickness of between 400 nm and 1.5 µm may be used. A lamination structure of an 800 nm thick silicon oxide film on a 200 nm thick silicon oxynitride film is used in embodiment 1.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 336. Namely, hydrogen processing may be performed as above after forming the 200 nm thick silicon oxynitride film, and then the remaining 800 nm thick silicon oxide film may be formed.

A contact hole is formed next in the first interlayer insulating film 336, and source wirings 337 to 340, and drain wirings 341 to 343 are formed. In embodiment 1, a lamination film with a three layer structure of a 100 nm titanium film, a 300 nm aluminum film containing titanium, and a 150 nm titanium film formed successively by sputtering, is used as these wirings. Other conducting films may also be used, of course, and an alloy film containing silver, palladium, and copper may also be used.

A first passivation film 344 is formed next with a thickness of 50 to 500 nm (typically between 200 and 300 nm). A 300 nm thick silicon oxynitride film is used as the first passivation film 344 in embodiment 1. This may also be substituted by a silicon nitride film. It is of course possible to use the same materials as those of the first passivation film 41 of FIG. 1.

Note that it is effective to perform plasma processing using a gas containing hydrogen such as $H_2$ or $NH_3$ before the formation of the silicon oxynitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Figure 5B:
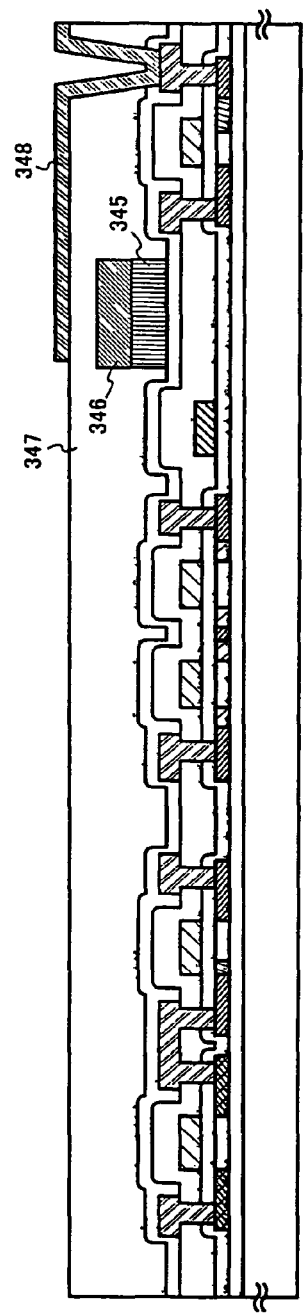

Next, as shown in FIG. 5B, a color filter 345 and a fluorescing body 346 are formed. Known materials may be used for these. Furthermore, they may be formed by being patterned separately, or they may be formed in succession and then patterned together. A method such as screen printing, ink jetting, or mask evaporation (a selective forming method using a mask material) may be used as the formation method.

The respective film thickness may be chosen in the range of 0.5 to 5 µm (typically between 1 and 2 µm). In particular, the optimal film thickness of the fluorescing body 346 varies with the material used. In other words, if it is too thin, then the color transformation efficiency becomes poor, and if it is too thick, then the step becomes large and the amount of light transmitted drops. Optimal film thicknesses must therefore be set by taking a balance of both characteristics.

Note that, in embodiment 1, an example of a color changing method in which the light emitted from the EL layer is transformed in color, but if a method of manufacturing individual EL layers which correspond to R, G, and B, is employed, then the color filter and the fluorescing body can be omitted.

A second interlayer insulating film 347 is formed next from an organic resin. Materials such as polyimide, polyamide, acrylic, and BCB (benzocyclobutene) can be used as the organic resin. In particular, the purpose of being a leveling film is strong in the second interlayer insulating film 347, and therefore acrylic, having superior leveling characteristics, is preferable. An acrylic film is formed in embodiment 1 with a film thickness which can sufficiently level the step between the color filter 345 and the fluorescing body 346. This thickness is preferably from 1 to 5 µm (more preferably between 2 and 4 µm).

A contact hole for reaching the drain wiring 343 is formed next in the second interlayer insulating film 347 and in the first passivation film 344, and a pixel electrode 348 is formed. A compound of indium oxide and tin oxide is formed into 110 nm thick in embodiment 1, and patterning is performed, making the pixel electrode. The pixel electrode 348 becomes an anode of the EL element. Note that it is also possible to use other materials: a compound film of indium oxide and zinc oxide, or a zinc oxide film containing gallium oxide.

Note that embodiment 1 becomes a structure in which the pixel electrode 348 is electrically connected to the drain region 331 of the current control TFT, through the drain wiring 343. This structure has the following advantages.

The pixel electrode 348 becomes directly connected to an organic material such as the EL layer (emitting layer) or a charge transporting layer, and therefore it is possible for the mobile ions contained in the EL layer to diffuse throughout the pixel electrode. In other words, without connecting the pixel electrode 348 directly to the drain region. 331, a portion of the active layer, the introduction of mobile ions into the active layer due to the drain wiring 343 being interrupted can be prevented in the structure of embodiment 1.

Figure 5C:
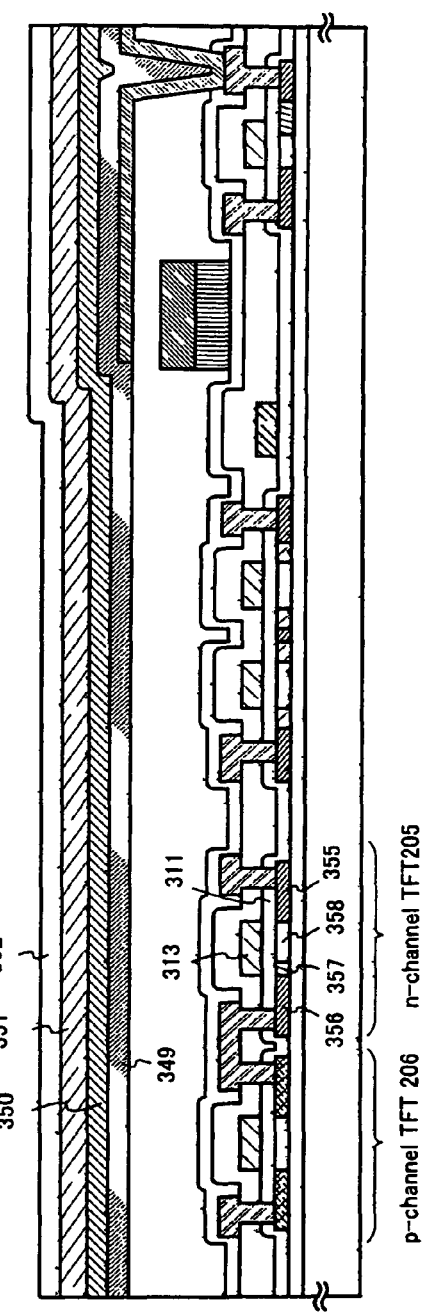

Next, as shown in FIG. 5C, an EL layer 349, a cathode (MgAg electrode) 350, and a protecting electrode 351 are formed in succession without exposure to the atmosphere. It is preferable, at this point, to perform heat treatment of the pixel electrode 348, completely removing all moisture, before forming the EL layer 349 and the cathode 350. Note that a known material can be used as the EL layer 349.

Figure 19:
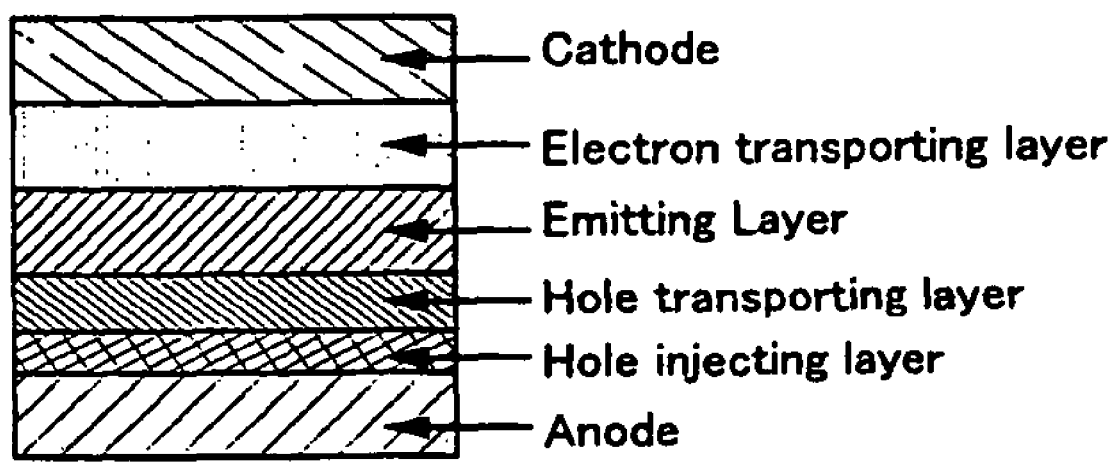
FIG. 19 is a diagram showing the laminate structure of an EL layer.

The materials explained in the "embodiment mode" section of this specification can be used as the EL layer 349. In embodiment 1, an EL layer having a 4 layer structure of a hole injecting layer, a hole transporting layer, an emitting layer, and an electron transporting layer is used, as shown in FIG. 19, but there are cases in which the electron transporting layer is not formed, and cases in which an electron injecting layer is also formed. Furthermore, there are also cases in which the hole injecting layer is omitted. Several examples of these types of combinations have already been reported, and any of these constitutions may be used.

An amine such as TPD (triphenylamine dielectric) may be used as the hole injecting layer or as the hole transporting layer, and in addition, a hydrazone (typically DEH), a stilbene (typically STB), or a starburst (typically m-MTDATA) can also be used. In particular, a starburst material, which has a high glass transition temperature and is difficult to crystallize, is preferable. Further, polyaniline (PAni), polythiophene (PEDOT), and copper phthalocyanine (CuPc) may also be used.

BPPC, perylene, and DCM can be used as a red color emitting layer in the emitting layer, and in particular, the Eu complex shown by Eu (DBM)$_3$ (Phen) (refer to Kido, J., et. al, Appl. Phys., vol. 35, pp. L394-6, 1996 for details) is highly monochromatic, possessing a sharp emission at a wavelength of 620 nm.

Further, typically an Alq$_3$ (8-hydroxyquinoline aluminum) material in which quinacridone or coumarin is added at a level of several mol % can be used as a green color emitting layer.

The chemical formula is as shown below.

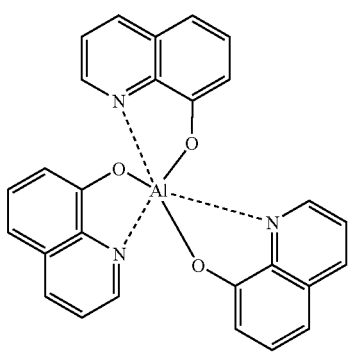

[formula 6]

In addition, typically a distile-arylene amino dielectric, in which amino substituted DSA is added to DSA (distile-arylene dielectric) can be used as a blue color emitting layer. In particular, it is preferable to use the high performance material distilyl-biphenyl (DPVBi). Its chemical formula is as shown below.

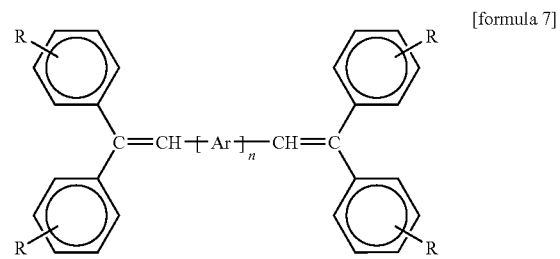

[formula 7]

Further, a 300 nm thick silicon nitride film is formed as a second passivation film 352, and this may also be formed in succession, without exposure to the atmosphere, after formation of the protecting electrode 351. The same materials as those of the second passivation film 49 of FIG. 1 can also be used, of course, as the second passivation film 352.

A 4 layer structure made from a hole injecting layer, a hole transporting layer, an emitting layer, and an electron injecting layer is used in embodiment 1, but there are already examples of many combinations already reported, and any of these constitutions may also be used. Furthermore, an MgAg electrode is used as the cathode of the EL element in embodiment 1, but other known materials may also be used.

The protecting electrode 351 is formed in order to prevent deterioration of the MgAg electrode 350, and a metallic film having aluminum as its principal constituent is typical. Other materials may, of course, also be used. Furthermore, the EL layer 349 and the MgAg electrode 350 are extremely weak with respect to moisture, and therefore it is preferable to perform successive formation up through to the protecting electrode 351 without exposure to the atmosphere, protecting the EL layer from external air.

Note that the film thickness of the EL layer 349 may be from 10 to 400 nm (typically between 60 and 160 nm), and that the thickness of the MgAg electrode 350 may be from 180 to 300 nm (typically between 200 and 250 nm).

The active matrix type EL display device with the structure shown in FIG. 5C is thus completed. By arranging TFTs with optimal structure in not only the pixel portion, but also in the driver circuit portion, the active matrix type EL display device of embodiment 1 shows extremely high reliability, and the operational characteristics can be raised.

First, a TFT having a structure which reduces hot carrier injection as much as possible without a drop in the operation speed is used as an n-channel TFT 205 of the CMOS circuit forming the driver circuits. Note that the driver circuits referred to here include circuits such as a shift register, a buffer, a level shifter, and a sampling circuit (also referred to as a transfer gate). When digital driving is performed, signal conversion circuits such as a D/A converter circuit are also included.

In the case of embodiment 1, an active layer of the n-channel TFT 205 includes a source region 355, a drain region 356, an LDD region 357, and a channel forming region 358, as shown in FIG. 5C, and the LDD region 357 overlaps the gate electrode 313, sandwiching the gate insulating film 311.

The formation of the LDD region on the drain side only is in consideration of not lowering the operation speed. Further, it is not necessary to be concerned with the value of the off current in the n-channel TFT 205, and greater emphasis may be placed on the operation speed. It is therefore preferable that the LDD region 357 completely overlap the gate electrode 313, reducing resistive components as much as possible. In other words, it is good to eliminate all offset.

Deterioration of a p-channel TFT 206 of the CMOS circuit due to hot carrier injection is almost of no concern, and in particular, therefore, an LDD region is not formed. It is also possible, of course, to take action against hot carriers by forming an LDD region similar to that of the n-channel TFT 205.

Note that among the driver circuits, the sampling circuit is somewhat special when compared to the other circuits, and a large current flows in the channel forming region in both directions. Namely, the roles of the source region and the drain region change. In addition, it is necessary to suppress the value of the off current as much as possible, and with that in mind, it is preferable to arrange a TFT having functions at an intermediate level between the switching TFT and the current control TFT.

Figure 9:
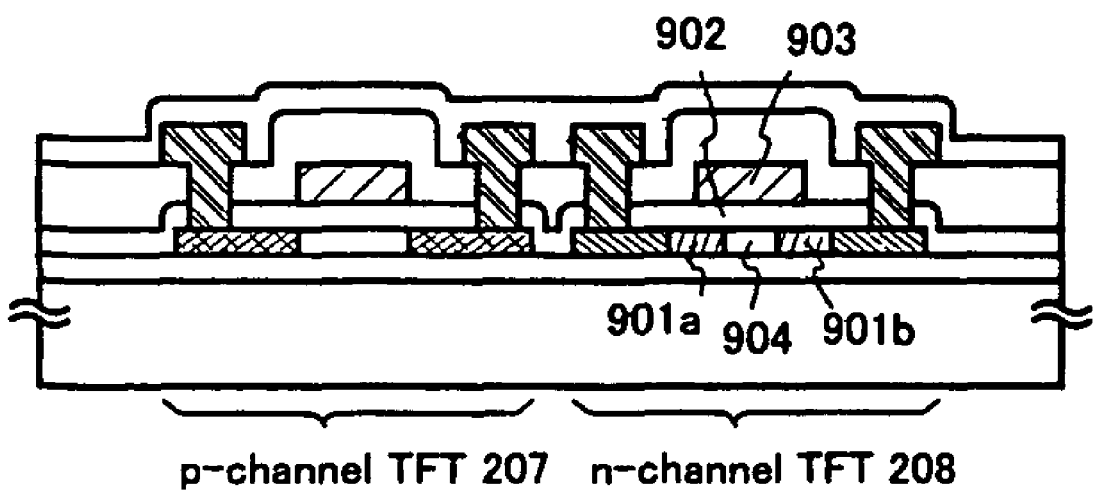
FIG. 9 is a diagram showing the element structure of a sampling circuit of an EL display device.

It is preferable, therefore, to arrange a TFT with the structure shown in FIG. 9 as an n-type TFT forming the sampling circuit. As shown in FIG. 9, a portion of LDD regions 901*a* and 901*b* overlap a gate electrode 903, sandwiching a gate insulating film 902. This effect is as stated in the explanation of the current control TFT 202, and the case of the sampling circuit differs in the point of forming the LDD regions 901*a* and 901*b* with a shape that sandwiches a channel forming region 904.

Further, a pixel with the structure shown in FIG. 1 is formed, forming a pixel portion. The structures of a switching TFT and a current control TFT formed within the pixel have already been explained in FIG. 1, and therefore that explanation is omitted here.

Note that, in practice, it is preferable to additionally perform packaging (sealing) after completing up through FIG. 5C by using a housing material such as a highly airtight protecting film (such as a laminar film or an ultraviolet hardened resin film) or a ceramic sealing can, so that there is no exposure to the atmosphere. By making the inside of the housing material an inert environment, and by placing an absorbing agent (for example, barium oxide) within the housing material, the reliability (life) of the EL layer is increased.

Furthermore, after the airtightness is increased by the packaging processing, a connector (a flexible printed circuit, FPC) for connecting between output terminals from elements or circuits formed on the substrate, and external signal terminals, is attached, completing a manufactured product. The EL display device in this state of being able to be shipped is referred to as an EL module throughout this specification.

Figure 6:
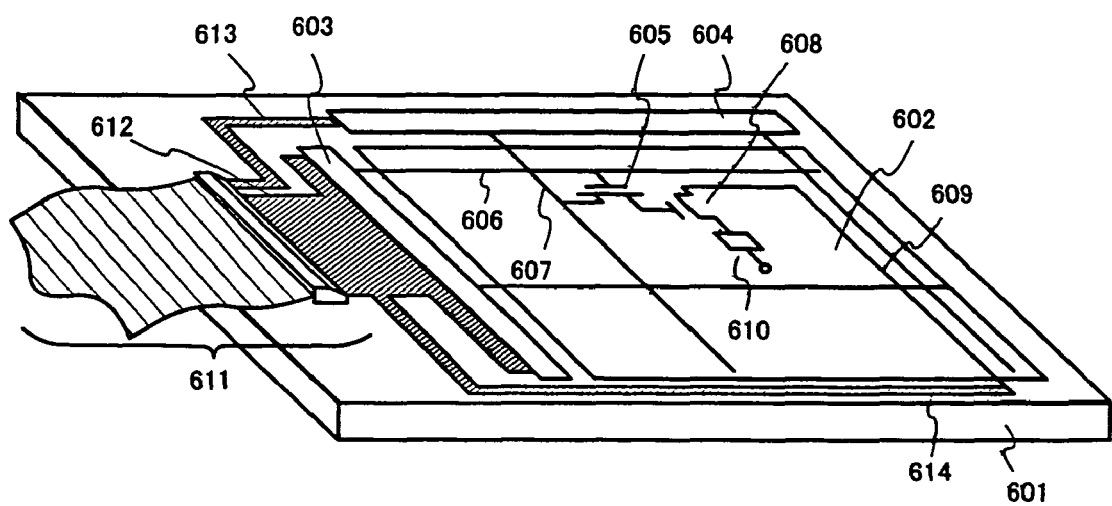
FIG. 6 is a diagram showing an external view of an EL module.

The constitution of the active matrix type EL display device of embodiment 1 is explained here using the perspective view of FIG. 6. The active matrix type EL display device of embodiment 1 is formed on a glass substrate 601, and is composed of a pixel portion 602, a gate side driving circuit 603, and a source side driving circuit 604. A switching TFT 605 of the pixel portion is an n-channel TFT, and is placed at the intersection of a gate wiring 606 connected to the gate side driving circuit 603, and a source wiring 607 of the source side driving circuit 604. Furthermore, the drain of the switching TFT 605 is electrically connected to the gate of a current control TFT 608.

In addition, the source of the current control TFT 608 is connected to a current supply line 609, and an EL element 610 is electrically connected to the drain of the current control TFT 608. Provided that the current control TFT 608 is an n-channel TFT, it is preferable to connect the cathode of the EL element 610 to the drain of the current control TFT 608 at this point. Further, if the current control TFT 608 is a p-channel TFT, then it is preferable to connect the anode of the EL element 610 to the drain of the current control TFT 608.

Input wirings (connection wirings) 612 and 613, and an input wiring 614 which is connected to the current supply line 609, are then formed in an external input terminal FPC 611 in order to transfer signals to the driver circuits.

Figure 7:
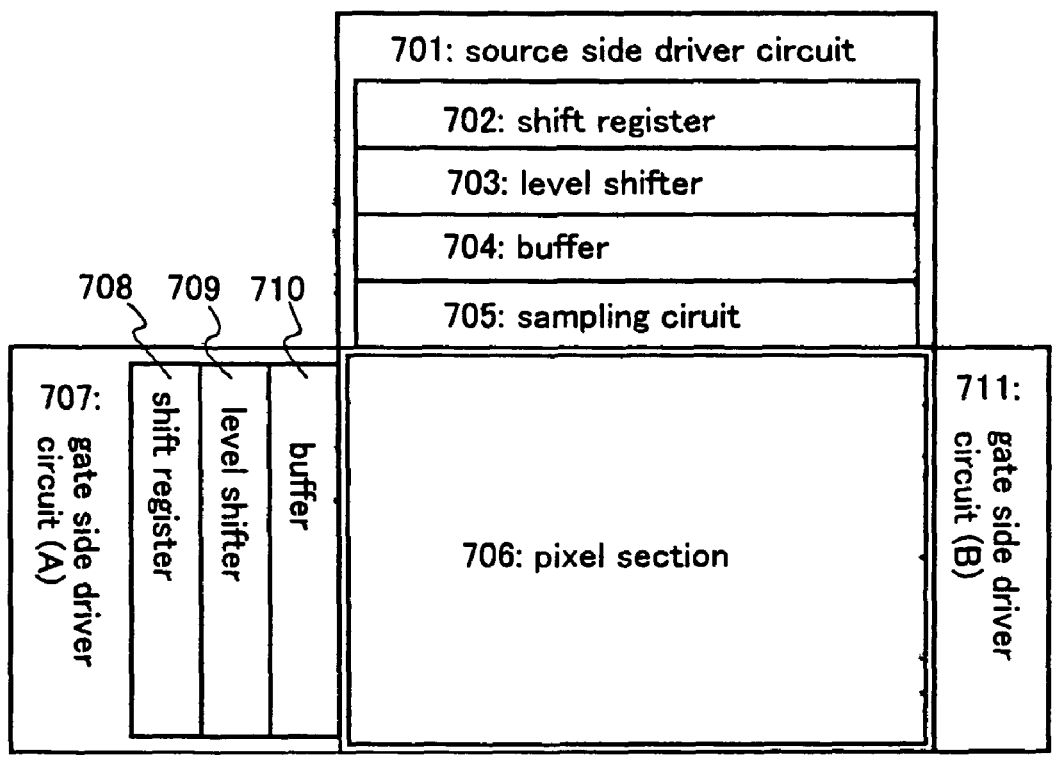
FIG. 7 is a diagram showing the circuit block structure of an EL display device.

Shown in FIG. 7 is one example of the circuit composition of the EL display device shown in FIG. 6. The EL display device of embodiment 1 has a source side driving circuit 701, a gate side driving circuit (A) 707, a gate side driving circuit (B) 711, and a pixel portion 706. Note that, throughout this specification, driver circuit is a generic term which includes source side processing circuits and gate side processing circuits.

The source side driving circuit 701 is provided with a shift register 702, a level shifter 703, a buffer 704, and a sampling circuit (transfer gate) 705. In addition, the gate side driving circuit (A) 707 is provided with a shift register 708, a level shifter 709, and a buffer 710. The gate side driving circuit (B) 711 has a similar composition.

The driving voltage is from 5 to 16 V (typically 10 V) for the shifter registers 702 and 708 here, and the structure shown by reference numeral 205 of FIG. 5C is suitable for an n-channel TFT used in a CMOS circuit forming the circuits.

Furthermore, the driving voltage becomes high at between 14 and 16 V for the level shifters 703 and 709, and for the buffers 704 and 710, and similar to the shifters, a CMOS circuit containing the n-channel TFT 205 of FIG. 5C is suitable. Note that the use of a multi-gate structure, such as a double gate structure or a triple gate structure for the gate wirings, is effective by increasing the reliability of each circuit.

The driving voltage is between 14 and 16 V for the sampling circuit 705, but it is necessary to reduce the value of the off current because the source region and the drain region invert, and therefore a CMOS circuit containing the n-channel TFT 208 of FIG. 9 is suitable.

In addition, the driving voltage of the pixel portion 706 is between 14 and 16 V, and a pixel with the structure shown in FIG. 1 is arranged.

Note that the above constitutions can be easily realized by manufacturing TFTs in accordance with the manufacturing processes shown in FIGS. 3A to 5C. Furthermore, only the constitution of the pixel portion and the driver circuits is shown in embodiment 1, but it is also possible to form other logic circuits, in addition to the driving circuits, on the same substrate and in accordance with the manufacturing process of embodiment 1, such as a signal divider circuit, a D/A converter circuit, an op-amp circuit, and a γ compensation circuit. In addition, it is considered that circuits such as a memory portion and a microprocessor can also be formed.

Figure 17A:
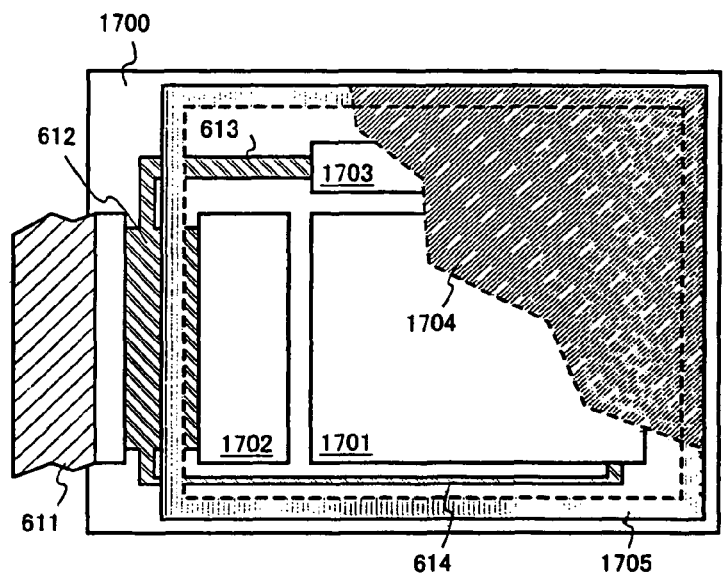
FIGS. 17A and 17B are diagrams showing external views of an EL module.
Figure 17B:
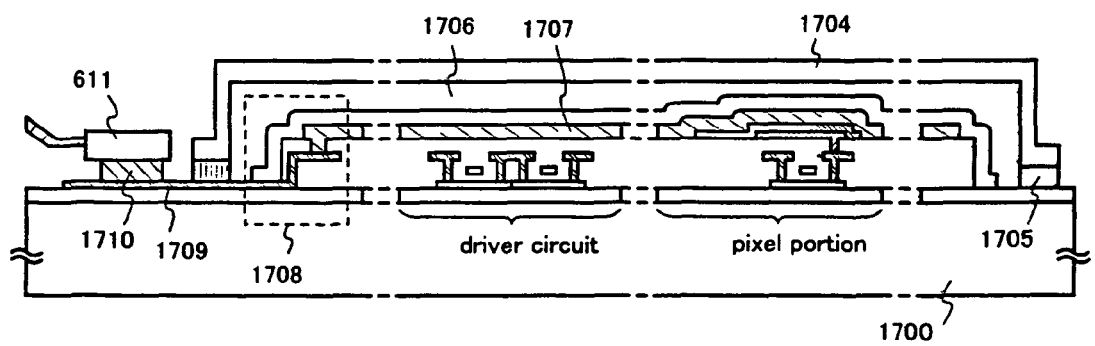

An explanation of the EL module of embodiment 1, containing the housing material, is made using FIGS. 17A and 17B. Note that, when necessary, the symbols used in FIGS. 6 and 7 are cited.

A pixel portion 1701, a source side driving circuit 1702, and a gate side driving circuit 1703 are formed on a substrate (including a base film underneath a TFT) 1700. Various wirings from the respective driver circuits are connected to external equipment, via the FPC 611, through the input wirings 612 to 614.

A housing material 1704 is formed at this point enclosing at least the pixel portion, and preferably the driving circuits and the pixel portion. Note that the housing material 1704 is of an irregular shape in which the internal size is larger than the external size of the EL element, or has a sheet shape, and is fixed to the substrate 1700 by an adhesive 1705 so as to form an airtight space jointly with the substrate 1700. At this point, the EL element is in a state of being completely sealed in the above airtight space, and is completely cutoff from the external atmosphere. Note that a multiple number of housing materials 1704 may be formed.

It is preferable to use an insulating substance such as a glass or a polymer as the housing material 1704. The following can be given as examples: amorphous glass (such as borosilicate glass or quartz); crystallized glass; ceramic glass; organic resins (such as acrylic resins, styrene resins, polycarbonate resins, and epoxy resins); and silicone resins. In addition, ceramics may also be used. Furthermore, provided that the adhesive 1705 is an insulating material, it is also possible to use a metallic material such as a stainless alloy.

It is possible to use an adhesive such as an epoxy resin or an acrylate resin as the material of the adhesive 1705. In addition, a thermally hardened resin or a light hardened resin can also be used as the adhesive. Note that it is necessary to use a material through which, as much as is possible, oxygen and moisture is not transmitted.

In addition, it is preferable to fill an opening 1706 between the housing material and the substrate 1700 with an inert gas (such as argon, helium, or nitrogen). There are no limitations on a gas, and it is also possible to use an inert liquid (such as a liquid fluorinated carbon, typically perfluoroalkane). The materials such as those used by Japanese Patent Application Laid-open No. Hei 8-78519 may be referred to regarding inert liquids. The space may also be filled with a resin.

It is effective to form drying agent in the opening 1706. Materials such as those recorded in Japanese Patent Application Laid-open No. Hei 9-148066 can be used as the drying agent. Typically, barium oxide may be used. Furthermore, it is effective to form an antioxidizing agent as well, not just a drying agent.

A plural number of isolated pixels having EL elements are formed in the pixel portion, as shown in FIG. 17B, and all of the pixels have a protecting electrode 1707 as a common electrode. In embodiment 1 it is preferable to form the EL layer, the cathode (MgAg electrode), and the protecting electrode in succession, without exposure to the atmosphere. The EL layer and the cathode are formed using the same mask material, and provided that only the protecting electrode is formed by a separate mask material, then the structure of FIG. 17B can be realized.

The EL layer and the cathode may be formed only in the pixel portion at this point, and it is not necessary to form them on the driving circuits. There is no problem, of course, with forming them on the driving circuits, but considering the fact that alkaline metals are contained in the EL layer, it is preferable to not form it over the driving circuits.

Note that an input wiring 1709 is connected to the protecting electrode 1707 in a region shown by reference numeral 1708. The input wiring 1709 is a wiring for providing a preset voltage to the protecting electrode 1707, and is connected to the FPC 611 through a conducting paste material (typically an anisotropic conducting film) 1710.

Figure 18A:
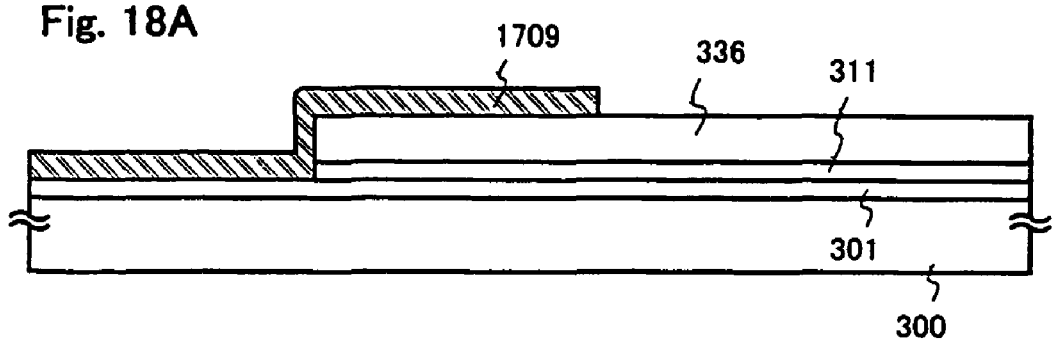
FIGS. 18A to 18C are diagrams showing manufacturing processes of a contact structure.
Figure 18B:
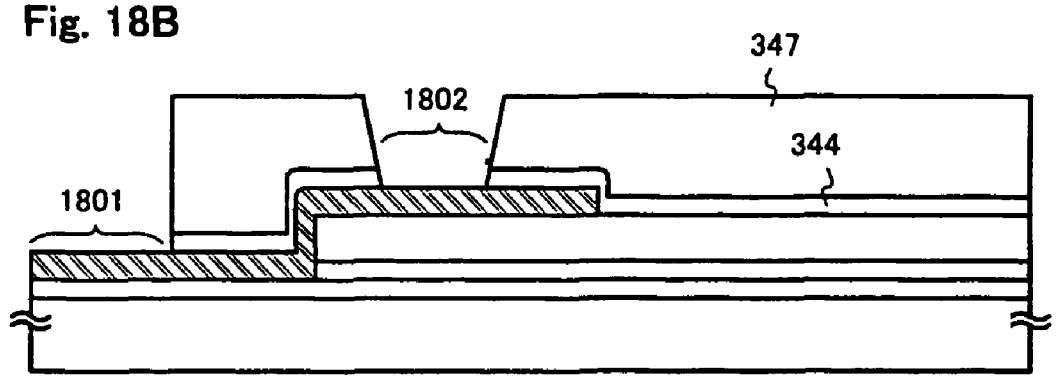
Figure 18C:
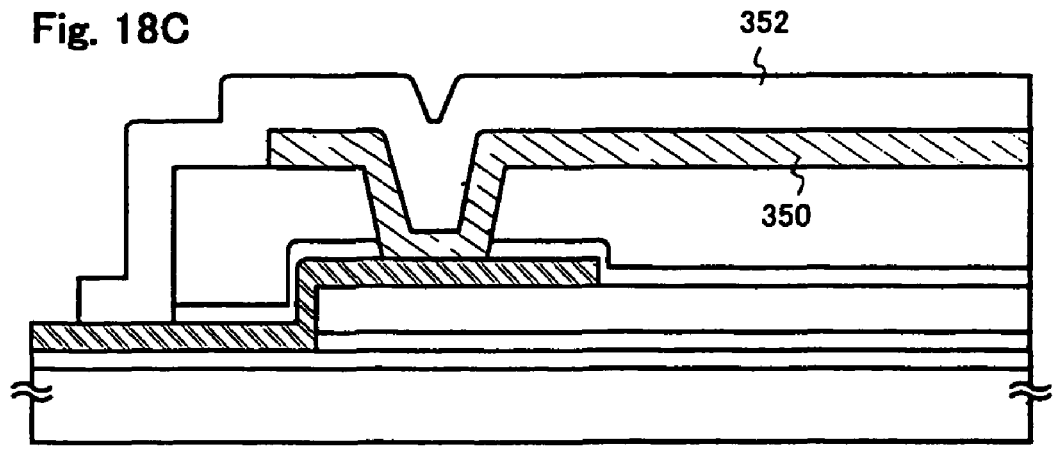

A manufacturing process for realizing a contact structure in the region 1708 is explained here using FIGS. 18A to 18C.

First, the state of FIG. 5A is obtained in accordance with the processes of embodiment 1. At this point the first interlayer insulating film 336 and the gate insulating film 311 are removed from the edges of the substrate (in the region shown by reference numeral 1708 in FIG. 17B), and the input wiring 1709 is formed on that region. The source wirings and the drain wirings of FIG. 5A are of course formed at the same time. (See FIG. 18A.)

Next, when etching the second interlayer insulating film 347 and the first passivation film 344 in FIG. 5B, a region shown by reference numeral 1801 is removed, and an open portion 1802 is formed. (See FIG. 18B.)

The processes of forming the EL element (pixel electrode, EL layer, and cathode formation processes) in the pixel portion are performed in this state. A mask material is used in the region shown in FIGS. 18A to 18C at this time so that the EL element is not formed in this region. After forming the cathode 349, the protecting electrode 350 is formed using a separate mask material. The protecting electrode 350 and the input wiring 1709 are thus electrically connected. Further, the second passivation film 352 is formed, and the state of FIG. 18C is obtained.

The contact structure of the region shown by reference numeral 1708 in FIG. 17B is thus realized by the above steps. The input wiring 1709 is then connected to the FPC 611 through the opening between the housing material 1704 and the substrate 1700 (note that this is filled by the adhesive 1705; in other words, it is necessary for the thickness of the adhesive 1705 to be such that it can sufficiently level the step of the input wiring). Note that an explanation of the input wiring 1709 is made here, but the other input wirings 612 to 614 are also similarly connected to the FPC 611 by passing under the housing material 1704.

Embodiment 2

Figure 10:
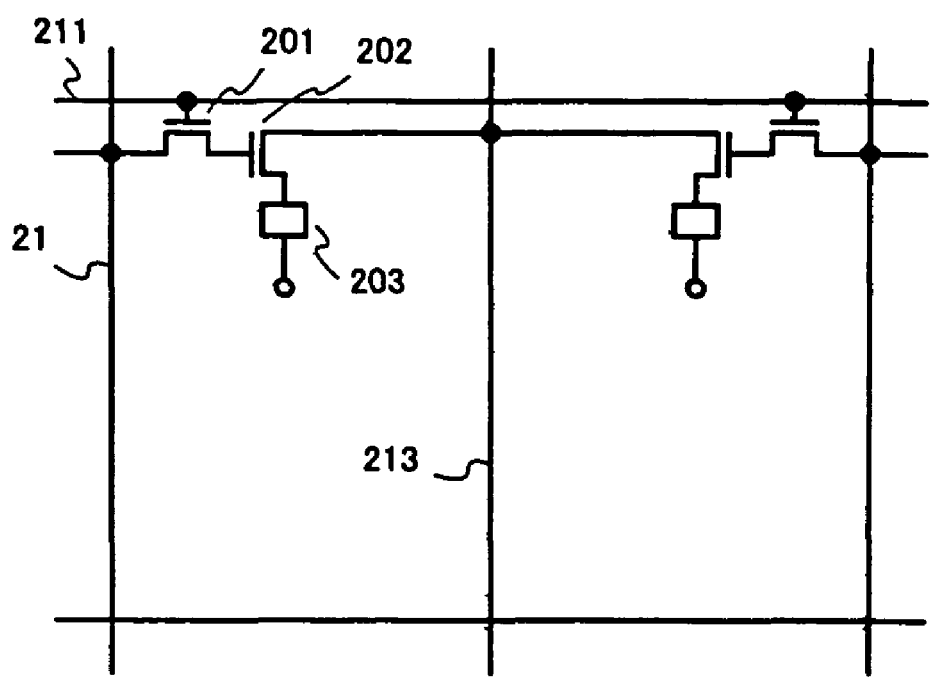
FIG. 10 is a diagram showing the composition of the pixel portion of an EL display device.

In embodiment 2, an example of a pixel constitution is shown in FIG. 10 which differs from the constitution shown in FIG. 2B.

The two pixels shown in FIG. 2B are arranged with symmetry around the current supply line in embodiment 2. Namely, as shown in FIG. 10, by making the current supply line 213 common between the two pixels neighboring the current supply line, the number of wirings needed can be reduced. Note that the structure of the TFTs placed inside the pixels may be left as is.

If this type of constitution is used, then it becomes possible to manufacture a very high definition pixel portion, increasing the image quality.

Note that the constitution of embodiment 2 can easily be realized in accordance with the manufacturing processes of embodiment 1, and that the explanations of embodiment 1 and of FIG. 1 may be referenced regarding points such as the structure of the TFTs.

Embodiment 3

Figure 11:
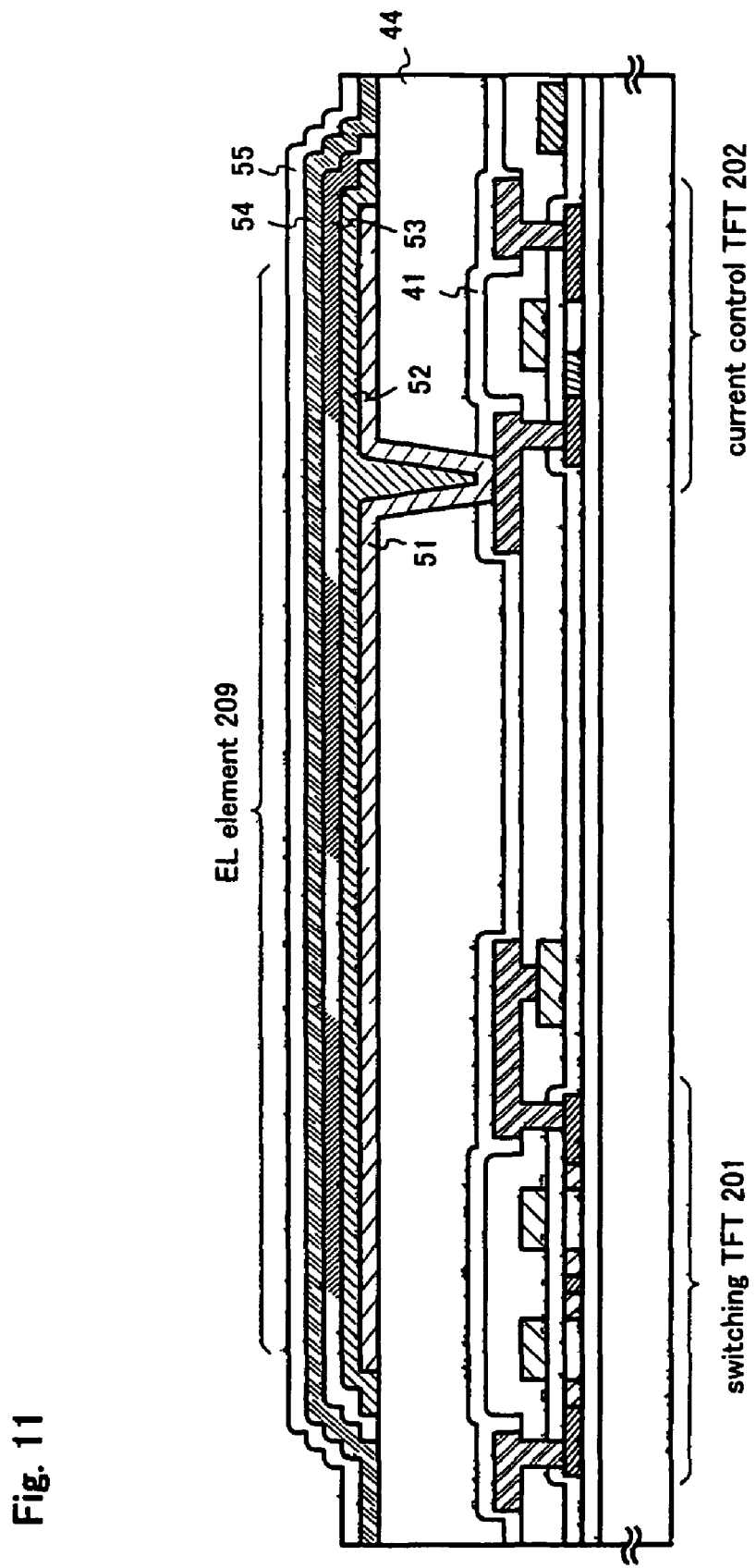
FIG. 11 is a diagram showing the cross sectional structure of an EL display device.

A case of forming a pixel portion having a structure which differs from that of FIG. 1 is explained using FIG. 11 in embodiment 3. Note that processes up through the formation of the second interlayer insulating film 44 may be performed in accordance with embodiment 1. Furthermore, the structures of the switching TFT 201 and the current control TFT 202, covered by the second interlayer insulating film 44, are the same as those of FIG. 1, and their explanation is therefore omitted.

In the case of embodiment 3, a pixel electrode 51, a cathode 52, and an EL layer 53 are formed after forming a contact hole in the second interlayer insulating film 44 and the first passivation film 41. The cathode 52 and the EL layer 53 are formed in succession, without exposure to the atmosphere, by vacuum evaporation in embodiment 3, and at that time a red color emitting EL layer, a green color emitting EL layer, and a blue color emitting layer are formed selectively in separate pixels by using a mask material. Note that while only one pixel is shown in FIG. 11, pixels with the same structure are formed corresponding to the colors of red, green, and blue, respectively, and that color display can be performed by these pixels. A known material may be employed for each EL layer color.

A 150 nm thick aluminum alloy film (an aluminum film containing 1 wt % of titanium) is formed as the pixel electrode 51 in embodiment 3. Provided that it is a metallic material, any material may be used as the pixel electrode material, but it is preferable to use a material having a high reflectivity. Further, a 230 nm thick MgAg electrode is used as the cathode 52, and the film thickness of the EL layer 53 is 90 nm (including, from the bottom, a 20 nm electron transporting layer, a 40 nm emitting layer, and a 30 nm hole transporting layer).

An anode 54 made from a transparent conducting film (an ITO film in embodiment 3) is formed next with a thickness of 110 nm. An EL element 209 is thus formed, and if a second passivation film 55 is formed by the same materials as shown in embodiment 1, then a pixel with the structure shown in FIG. 11 is completed.

When using the structure of embodiment 3, the red, green, or blue light generated by each pixel is irradiated in the opposite direction as that of the substrate on which the TFTs are formed. For that reason, almost the entire area inside the pixel, namely the region in which the TFTs are formed, can be used as an effective emitting region. As a result, there is a sharp increase in the effective emitting surface area of the pixel, and the brightness and the contrast ratio (the ratio between light and dark) of the image are increased.

Note that it is possible to freely combine the composition of embodiment 3 with the constitutions of any of embodiments 1 and 2.

Embodiment 4

Figure 12A:
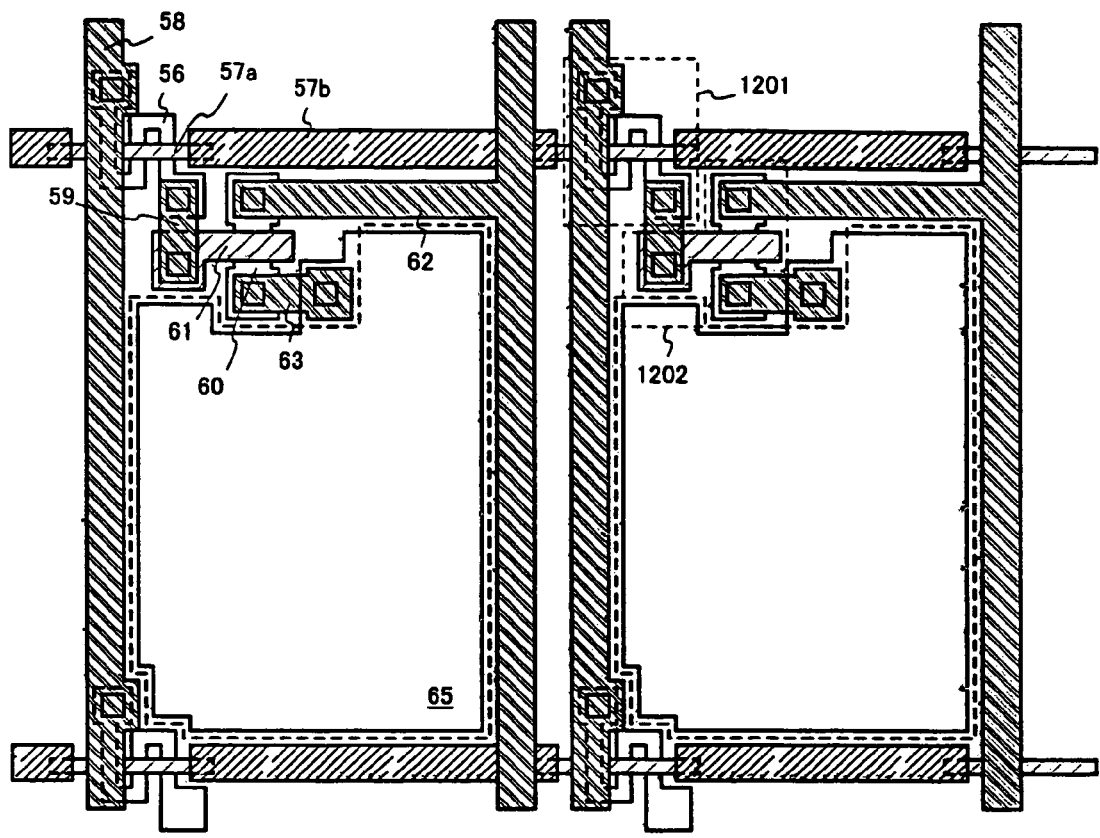
FIGS. 12A and 12B are diagrams showing the top view and the composition, respectively, of the pixel portion of an EL display device.
Figure 12B:
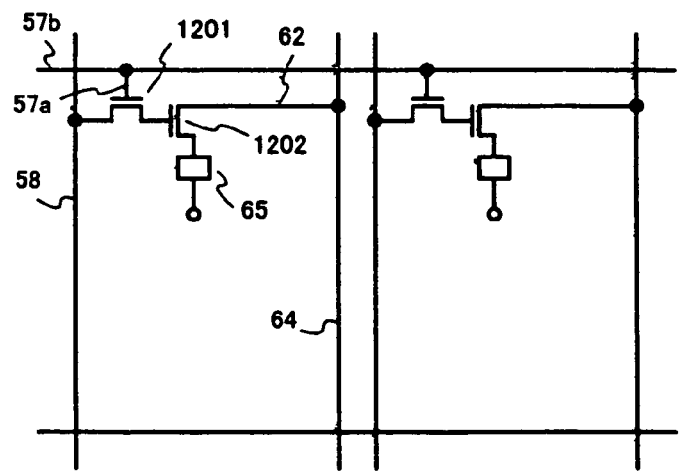

A case of forming a pixel having a structure which differs from that of FIG. 2 of embodiment 1 is explained in embodiment 4 using FIGS. 12A and 12B.

In FIG. 12A, reference numeral 1201 denotes a switching TFT, which comprises an active layer 56, a gate electrode 57a, a gate wiring 57b, a source wiring 58, and a drain wiring 59. Further, reference numeral 1202 denotes a current control TFT, which comprises an active layer 60, a gate electrode 61, a source wiring 62, and a drain wiring 63. The source wiring 62 of the current control TFT 1202 is connected to a current supply line 64, and the drain wiring 63 is connected to an EL element 65. FIG. 12B shows the circuit composition of this pixel.

The point of difference between FIG. 12A and FIG. 2A is the structure of the switching TFT. In embodiment 4 the gate electrode 57a is formed with a fine line width between 0.1 and 5 μm, and the active layer 56 is formed so as transverse that portion. The gate wiring 57b is formed so as to electrically connect the gate electrode 57a of each pixel. A triple gate structure which does not monopolize much surface area is thus realized.

Other portions are similar to those of FIG. 2A, and the effective emitting surface area becomes larger because the surface area exclusively used by the switching TFT becomes smaller if the structure of embodiment 4 is employed. In other words, the image brightness is increased. Furthermore, a gate structure in which redundancy is increased in order to reduce the value of the off current can be realized, and therefore the image quality can be increased even further.

Note that, in the constitution of embodiment 4, the current supply line 64 can be made common between neighboring pixels, as in embodiment 2, and that a structure like that of embodiment 3 may also be used. Furthermore, processes of manufacturing may be performed in accordance with those of embodiment 1.

Embodiment 5

Cases in which a top gate type TFT is used are explained in embodiments 1 to 4, and the present invention may also be implemented using a bottom gate type TFT. A case of implementing the present invention by using a reverse stagger type TFT is explained in embodiment 5 using FIG. 13. Note that, except for the structure of the TFT, the structure is the same as that of FIG. 1, and therefore the same symbols as those of FIG. 1 are used when necessary.

Figure 13:
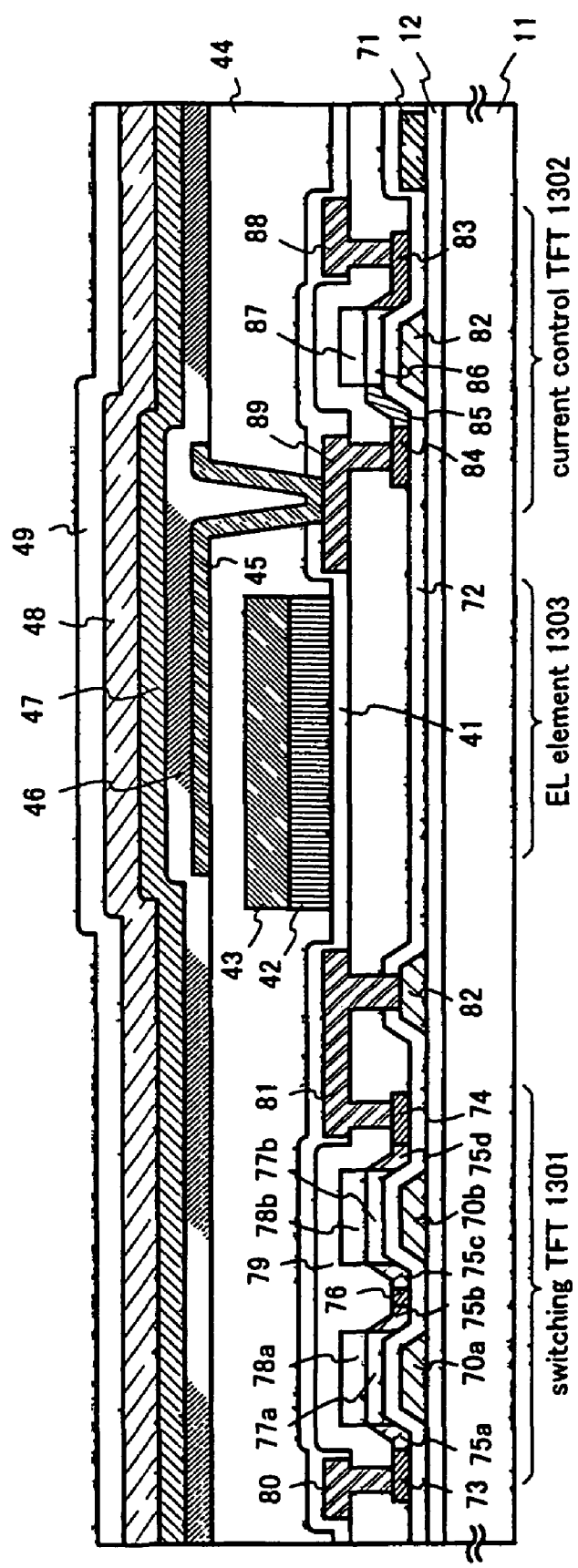
FIG. 13 is a diagram showing the cross sectional structure of the pixel portion of an EL display device.

In FIG. 13, the similar materials as those of FIG. 1 can be used in the substrate 11 and in the base film 12. A switching TFT 1301 and a current control TFT 1302 are then formed on the base film 12.

The switching TFT 1301 comprises: gate electrodes 70a and 70b; a gate wiring 71; a gate insulating film 72; a source region 73; a drain region 74; LDD regions 75a to 75d; a high concentration impurity region 76; channel forming regions 77a and 77b; channel protecting films 78a and 78b; a first inter layer insulating film 79; a source wiring 80; and a drain wiring 81.

Further, the current control TFT 1302 comprises: a gate electrode 82; the gate insulating film 72; a source region 83; a drain region 84; an LDD region 85; a channel forming region 86; a channel protecting film 87; a first interlayer insulating film 79; a source wiring 88; and a drain wiring 89. The gate electrode 82 is electrically connected to the drain wiring 81 of the switching TFT 1301 at this point.

Note that the above switching TFT 1301 and the current control TFT 1302 may be formed in accordance with a known method of manufacturing a reverse stagger type TFT. Further, similar materials used in corresponding portions of the top gate type TFTs of embodiment 1 can be used for the materials of each portion (such as wirings, insulating films, and active layers) formed in the above TFTs. Note that the channel protecting films 78a, 78b, and 87, which are not in the constitution of the top gate type TFT, may be formed by an insulating film containing silicon. Furthermore, regarding the formation of impurity regions such as the source regions, the drain regions, and the LDD regions, they may be formed by using a photolithography technique and individually changing the impurity concentration.

When the TFTs are completed, a pixel having an EL element 1303 in which the first passivation film 41, the insulating film (leveling film) 44, the second passivation film 49, the pixel electrode (anode) 46, the EL layer 47, the MgAg electrode (cathode) 45, the aluminum electrode (protecting film) 48, and the third passivation film 50 are formed in order, is completed. Embodiment 1 may be referred to with respect to manufacturing processes and materials for the above.

Note that it is possible to freely combine the constitution of embodiment 5 with the constitution of any of embodiments 2 to 4.

Embodiment 6

It is effective to use a material having a high thermal radiating effect, similar to that of the first passivation film 41 and the second passivation film 49, as the base film formed between the active layer and the substrate in the structures of FIG. 5C of embodiment 1 or FIG. 1. In particular, a large amount of current flows in the current control TFT, and therefore heat is easily generated, and deterioration due to self generation of heat can become a problem. Thermal deterioration of the TFT can be prevented by using the base film of embodiment 6, which has a thermal radiating effect, for this type of case.

The effect of protecting from the diffusion of mobile ions from the substrate is also very important, of course, and therefore it is preferable to use a lamination structure of a compound including Si, Al, N, O, and M, and an insulating film containing silicon, similar to the first passivation film 41.

Note that it is possible to freely combine the constitution of embodiment 6 with the constitution of any of embodiments 1 to 5.

Embodiment 7

When the pixel structure shown in embodiment 3 is used, the light emitted from the EL layer is radiated in the direction opposite to the substrate, and therefore it is not necessary to pay attention to the transmissivity of materials, such as the insulating film, which exist between the substrate and the pixel electrode. In other words, materials which have a somewhat low transmissivity can also be used.

It is therefore advantageous to use a carbon film, such as one referred to as a diamond thin film, a diamond-like carbon film, or an amorphous carbon film, as the base film 12 or the first passivation film 41. In other words, because it is not necessary to worry about lowering the transmissivity, the film thickness can be set thick, to between 100 and 500 nm, and it is possible to have a very high thermal radiating effect.

Regarding the use of the above carbon films in the second passivation film 49, note that a reduction in the transmissivity must be avoided, and therefore it is preferable to set the film thickness to between 5 and 100 nm.

Note that, in embodiment 7, it is effective to laminate with another insulating film when a carbon film is used in any of the base film 12, the first passivation film 41 and the second passivation film 49.

In addition, embodiment 7 is effective when the pixel structure shown in embodiment 3 is used, and for other constitutions, it is possible to freely combine the constitution of embodiment 7 with the constitution of any of embodiments 1 to 6.

Embodiment 8

The amount of the off current value in the switching TFT in the pixel of the EL display device is reduced by using a multi-gate structure for the switching TFT, and the present invention is characterized by the elimination of the need for a storage capacitor. This is a device for making good use of the surface area, reserved for the storage capacitor, as an emitting region.

However, even if the storage capacitor is not completely eliminated, an effect of increasing the effective emitting surface area, by the amount that the exclusive surface area is made smaller, can be obtained. In other words, the object of the present invention can be sufficiently achieved by reducing the value of the off current by using a multi-gate structure for the switching TFT, and by only shrinking the exclusive surface area of the storage capacitor.

Figure 14:
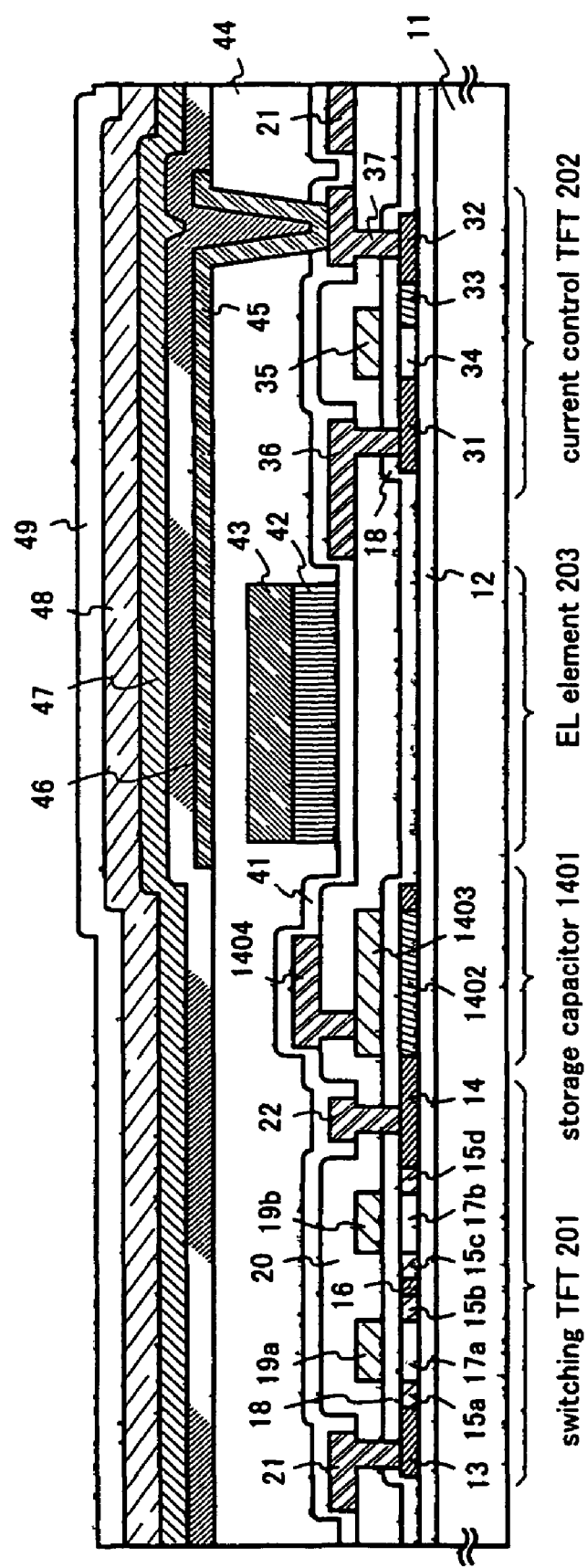
FIG. 14 is a diagram showing the cross sectional structure of the pixel portion of an EL display device.

It is therefore possible to use a pixel structure such as that shown in FIG. 14. Note that, when necessary, the same symbols are used in FIG. 14 as in FIG. 1.

The different point between FIG. 14 and FIG. 1 is the existence of a storage capacitor 1401 connected to the switching TFT. The storage capacitor 1401 is formed by a semiconductor region (lower electrode) extended from the drain region 14 of the switching TFT 201, the gate insulating film 18, and a capacitor electrode (upper electrode) 1403. The capacitor electrode 1403 is formed at the same time as the gate electrodes 19a, 19b, and 35 of the TFT.

Figure 15A:
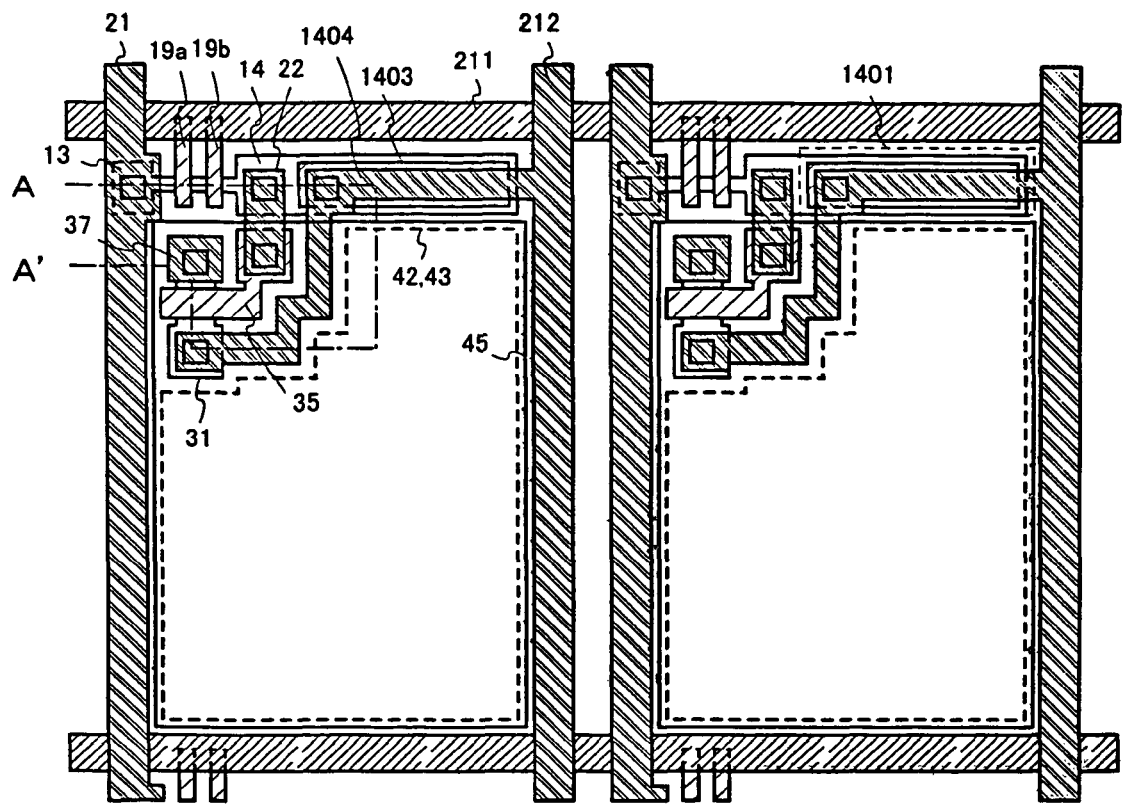
FIGS. 15A and 15B are diagrams showing the top view and the composition, respectively, of the pixel portion of an EL display device.
Figure 15B:
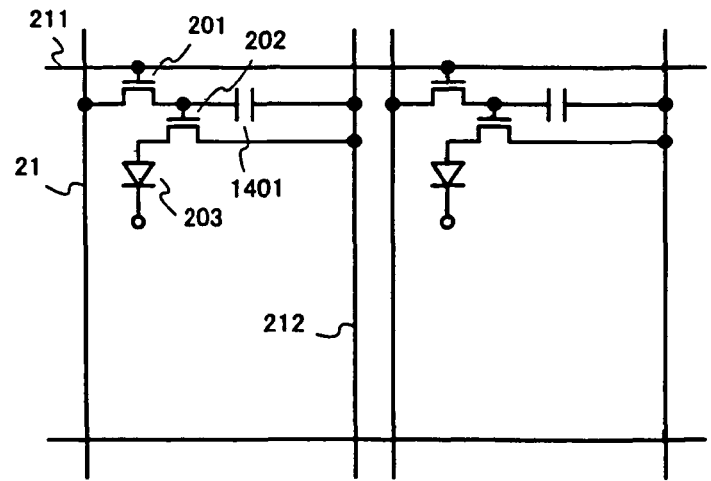

A top view is shown in FIG. 15A. The cross sectional diagram taken along the line A-A' in the top view of FIG. 15A corresponds to FIG. 14. As shown in FIG. 15A, the capacitor electrode 1403 is electrically connected to the source region 31 of the current control TFT through a connecting wiring 1404 which is electrically connected to the capacitor electrode 1403. Note that the connection wiring 1404 is formed at the same time as the source wirings 21 and 36, and the drain wirings 22 and 37. Furthermore, FIG. 15B shows the circuit constitution of the top view shown in FIG. 15A.

Note that the constitution of embodiment 8 can be freely combined with the constitution of any of embodiments 1 to 7. In other words, only the storage capacitor is formed within the pixel, no limitations are added with regard to the TFT structure or the EL layer materials.

Embodiment 9

Laser crystallization is used as the means of forming the crystalline silicon film 302 in embodiment 1, and a case of using a different means of crystallization is explained in embodiment 9.

After forming an amorphous silicon film in embodiment 9, crystallization is performed using the technique recorded in Japanese Patent Application Laid-open No. Hei 7-130652. The technique recorded in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application Laid-open No. Hei 11-076967 by the applicant of the present invention.

The processes of manufacturing shown in embodiment 1 are one embodiment of the present invention, and provided that the structure of FIG. 1 or of FIG. 5C of embodiment 1 can be realized, then other manufacturing process may also be used without any problems, as above.

Note that it is possible to freely combine the constitution of embodiment 9 with the constitution of any of embodiments 1 to 8.

Embodiment 10

In driving the EL display device of the present invention, analog driving can be performed using an analog signal as an image signal, and digital driving can be performed using a digital signal.

When analog driving is performed, the analog signal is sent to a source wiring of a switching TFT, and the analog signal, which contains gray scale information, becomes the gate voltage of a current control TFT. The current flowing in an EL element is then controlled by the current control TFT, the EL element emitting intensity is controlled, and gray scale display is performed. In this case, it is preferable to operate the current control TFT in a saturation region. In other words, it is preferable to operate the TFT within the conditions of $|V_{ds}|>|V_{gs}-V_{th}|$. Note that $V_{ds}$ is the voltage difference between a source region and a drain region, $V_{gs}$ is the voltage difference between the source region and a gate electrode, and $V_{th}$ is the threshold voltage of the TFT.

On the other hand, when digital driving is performed, it differs from the analog type gray scale display, and gray scale display is performed by time division driving (time ratio gray scale driving) or surface area ratio gray scale driving. Namely, by regulating the length of the emission time or the ratio of emitting surface area, color gray scales can be made to be seen visually as changing. In this case, it is preferable to operate the current control TFT in the linear region. In other words, it is preferable to operate the TFT within the conditions of $|V_{ds}|<|V_{gs}-V_{th}|$.

The EL element has an extremely fast response speed in comparison to a liquid crystal element, and therefore it is possible to have high speed driving. Therefore, the EL element is one which is suitable for time ratio gray scale driving, in which one frame is partitioned into a plural number of subframes and then gray scale display is performed. Furthermore, it has the advantage of the period of one frame being short, and therefore the amount of time for which the gate voltage of the current control TFT is maintained is also short, and a storage capacitor can be made smaller or eliminated.

The present invention is a technique related to the element structure and therefore any method of driving it may thus be used.

Embodiment 11

Figure 21A:
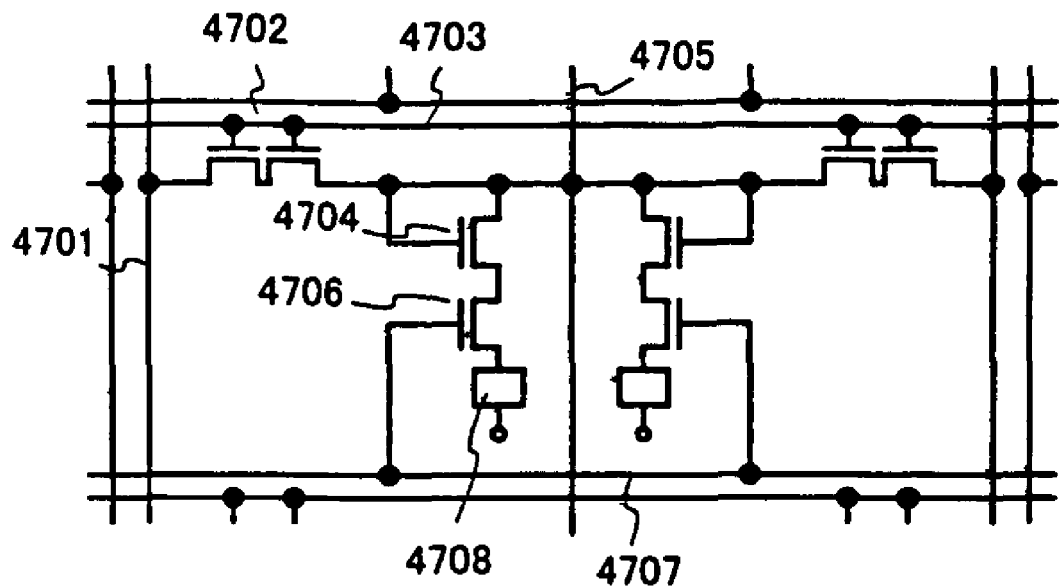
FIGS. 21A and 21B are diagrams showing the circuit composition of the pixel portion of an EL display device.
Figure 21B:
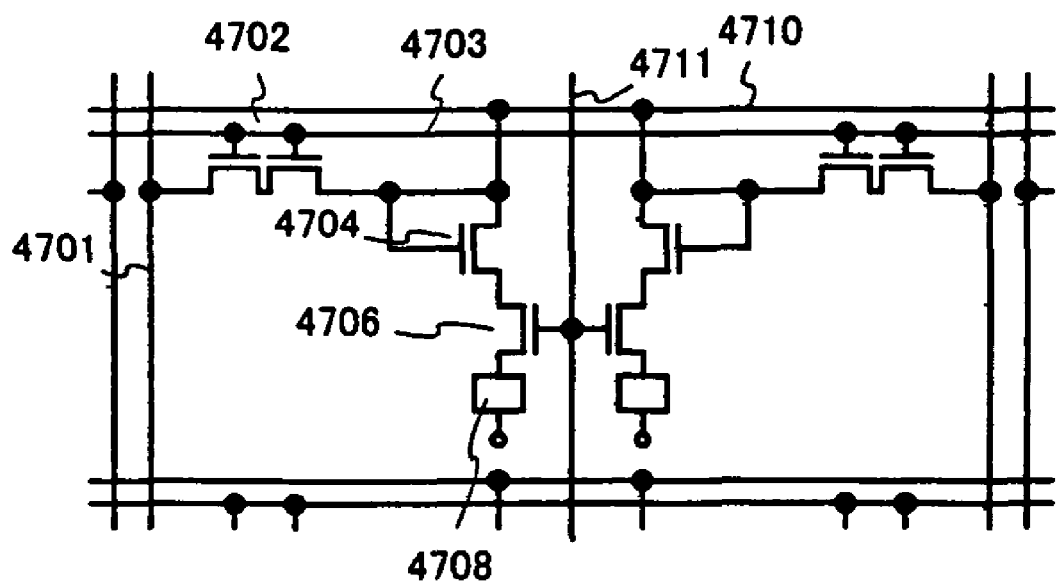

In embodiment 11, examples of the pixel structure of the EL display device of the present invention are shown in FIGS. 21A and 21B. Note that in embodiment 11, reference numeral 4701 denotes a source wiring of a switching TFT 4702, reference numeral 4703 denotes a gate wiring of the switching TFT 4702, reference numeral 4704 denotes a current control TFT, 4705 denotes an electric current supply line, 4706 denotes a power source control TFT, 4707 denotes a power source control gate wiring, and 4708 denotes an EL element. Japanese Patent Application Laid-open No. Hei 11-341272 may be referred to regarding the operation of the power source control TFT 4706.

Further, in embodiment 11 the power source control TFT 4706 is formed between the current control TFT 4704 and the EL element 4708, but a structure in which the current control TFT 4704 is formed between the power source control TFT 4706 and the EL element 4708 may also be used. In addition, it is preferable for the power source control TFT 4706 to have the same structure as the current control TFT 4704, or for both to be formed in series by the same active layer.

FIG. 21A is an example of a case in which the electric current supply line 4705 is common between two pixels. Namely, this is characterized in that the two pixels are formed having linear symmetry around the electric current supply line 4705. In this case, the number of electric current supply lines can be reduced, and therefore the pixel portion can be made even more high precision.

Furthermore, FIG. 21B is an example of a case in which an electric current supply line 4710 is formed parallel to the gate wiring 4703, and in which a power source control gate wiring 4711 is formed parallel to the source wiring 4701. Note that in FIG. 23B, the structure is formed such that the electric current supply line 4710 and the gate wiring 4703 do not overlap, but provided that both are wirings formed on different layers, then they can be formed to overlap, sandwiching an insulating film. In this case, the exclusive surface area of the electric current supply line 4710 and the gate wiring 4703 can be shared, and the pixel section can be made even more high precision.

Embodiment 12

Figure 22A:
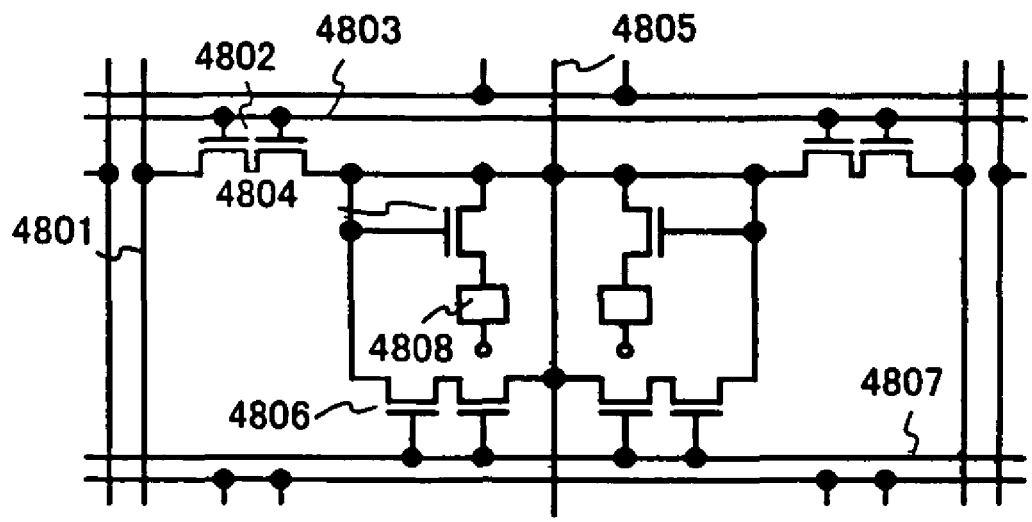
FIGS. 22A and 22B are diagrams showing the circuit composition of the pixel portion of an EL display device.
Figure 22B:
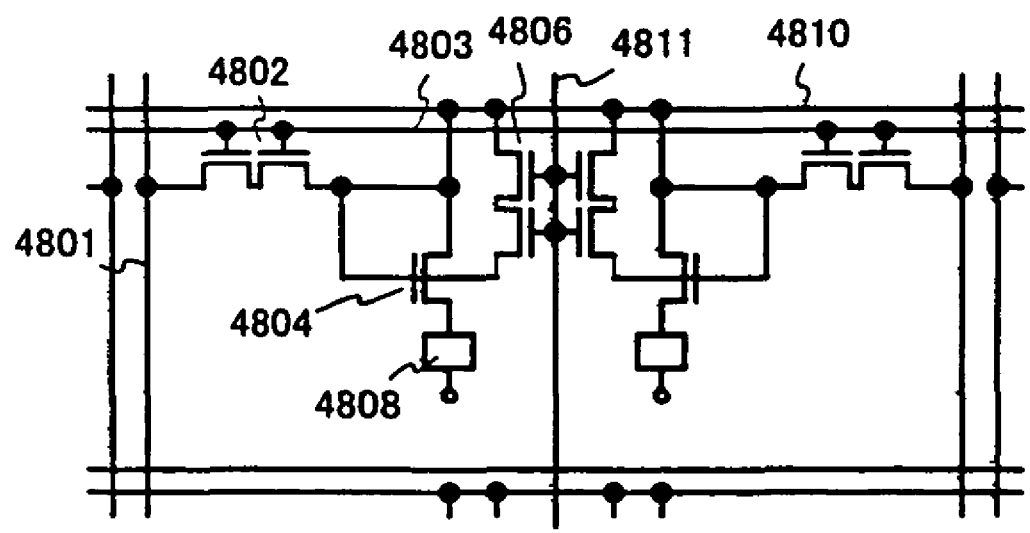

In embodiment 12, examples of the pixel structure of the EL display device of the present invention are shown in FIGS. 22A and 22B. Note that in embodiment 12, reference numeral 4801 denotes a source wiring of a switching TFT 4802, reference numeral 4803 denotes a gate wiring of the switching TFT 4802, reference numeral 4804 denotes a current control TFT, 4805 denotes an electric current supply line, 4806 denotes an erasure TFT, 4807 denotes an erasure gate wiring, and 4808 denotes an EL element. Japanese Patent Application Laid-open No. Hei 11-338786 may be referred to regarding the operation of the erasure TFT 4806.

The drain of the erasure TFT 4806 is connected to a gate of the current control TFT 4804, and it becomes possible to forcibly change the gate voltage of the current control TFT 4804. Note that an n-channel TFT or a p-channel TFT may be used for the erasure TFT 4806, but it is preferable to make it the same structure as the switching TFT 4802 so that the off current value can be made smaller.

FIG. 22A is an example of a case in which the electric current supply line 4805 is common between two pixels. Namely, this is characterized in that the two pixels are formed having linear symmetry around the electric current supply line 4805. In this case, the number of electric current supply lines can be reduced, and therefore the pixel section can be made even more high precision.

In addition, FIG. 22B is an example of a case in which an electric current supply line 4810 is formed parallel to the gate wiring 4803, and in which an erasure gate wiring 4811 is formed parallel to the source wiring 4801. Note that in FIG. 22B, the structure is formed such that the electric current supply line 4810 and the gate wiring 4803 do not overlap, but provided that both are wirings formed on different layers, then they can be formed to overlap, sandwiching an insulating film. In this case, the exclusive surface area of the electric current supply line 4810 and the gate wiring 4803 can be shared, and the pixel section can be made even more high precision.

Embodiment 13

The EL display device of the present invention may have a structure in which several TFTs are formed within a pixel. In embodiments 11 and 12, examples of forming three TFTs are shown, but from 4 to 6 TFTs may also be formed. It is possible to implement the present invention without placing any limitations on the structure of the pixels of the EL display device.

Embodiment 14

An example of using a p-channel TFT as the current control TFT 202 of FIG. 1 is explained in embodiment 14. Note that other portions are the same as those of FIG. 1, and therefore a detailed explanation of the other portions is omitted.

Figure 23:
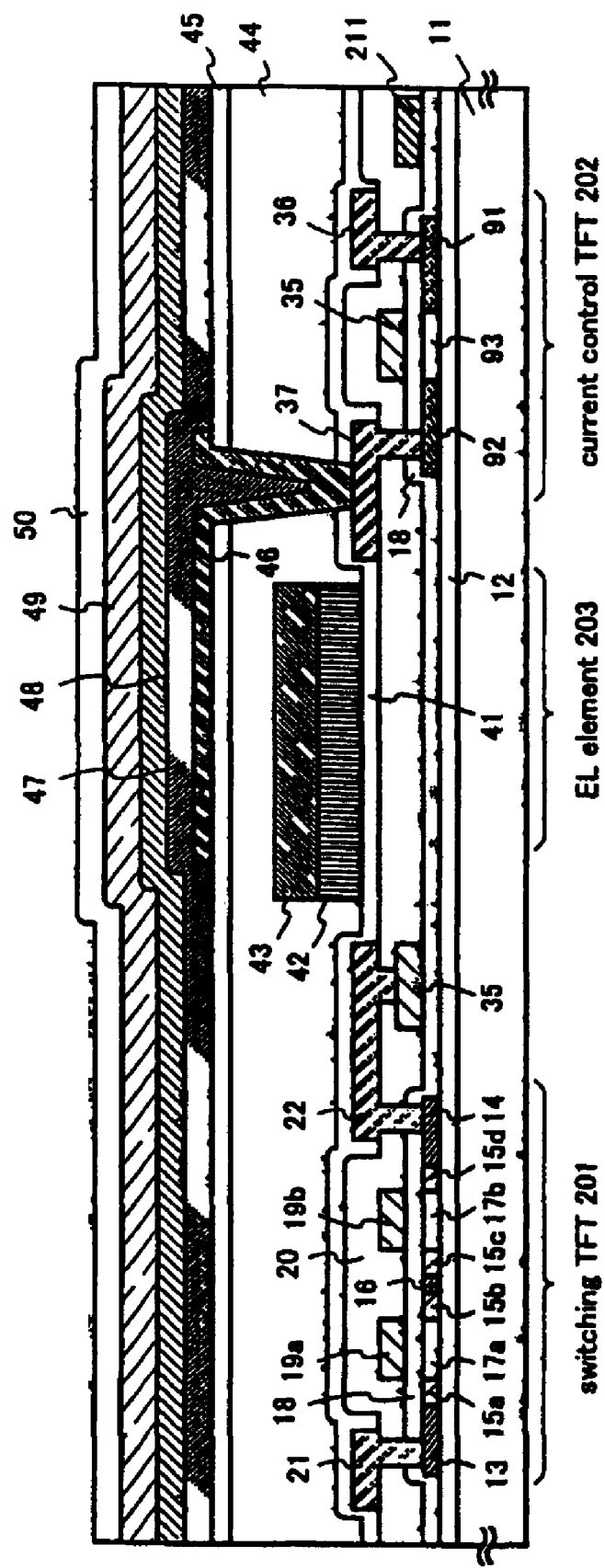
FIG. 23 is a diagram showing the cross sectional structure of the pixel portion of an EL display device.

A cross sectional structure of the pixel of embodiment 14 is shown in FIG. 23. Embodiment 1 may be referred to for a method of manufacturing the p-channel TFT used in embodiment 14. An active layer of the p-channel TFT comprises a source region 2801, a drain region 2802, and a channel forming region 2803, and the source region 2801 is connected to the source wiring 36, and the drain region 2802 is connected to the drain wiring 37.

For cases in which the anode of an EL element is connected to the current control TFT, it is preferable to use the p-channel TFT as the current control TFT.

Note that it is possible to implement the constitution of embodiment 14 by freely combining it with the constitution of any of embodiments 1 to 13.

Embodiment 15

By using an EL material in which phosphorescence from a triplet state exciton can be utilized in light emission in embodiment 15, the external emission quantum efficiency can be increased by a great amount. By doing so, it becomes possible to make the EL element into a low power consumption, long life, and low weight EL element.

Reports of utilizing triplet state excitons and increasing the external emission quantum efficiency is shown in the following papers.

Tsutsui, T., Adachi, C., and Saito, S., Photochemical Processes in Organized Molecular Systems, Ed. Honda, K., (Elsevier Sci. Pub., Tokyo, 1991), p. 437.

The molecular formula of the EL material (coumarin pigment) reported in the above paper is shown below.

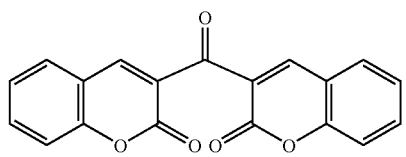

[formula 8]

Baldo, M. A., O'Brien, D. F., You, Y., Shoustikov, A., Sibley, S., Thompson, M. E., and Forrest, S. R., Nature 395 (1998) p. 151.

The molecular formula of the EL material (Pt complex) reported in the above paper is shown below.

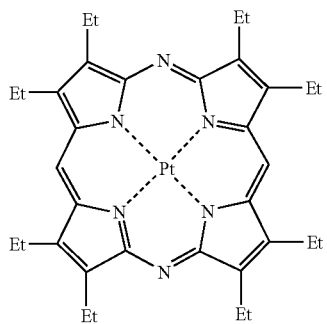

[formula 9]

Baldo, M. A., Lamansky, S., Burrows, P. E., Thompson, M. E., and Forrest, S. R., Appl. Phys. Lett., 75 (1999) p. 4.

Tsutsui, T., Yang, M. J., Yahiro, M., Nakamura, K., Watanabe, T., Tsuji, T., Fukuda, Y., Wakimoto, T., Mayaguchi, S., Jpn. Appl. Phys., 38 (12B) (1999) L1502.

The molecular formula of the EL material (Ir complex) reported in the above paper is shown below.

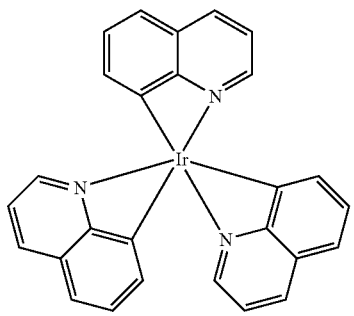

[formula 10]

Provided that the phosphorescence emission from triplet state excitons can be utilized, then in principle it is possible to realize an external emission quantum efficiency which is 3 to 4 times higher than that for cases of using the fluorescence emission from singlet state excitons. Note that it is possible to implement the constitution of embodiment 15 by freely combining it with the constitution of any of embodiments 1 to 13.

Embodiment 16

In embodiment 1 it is preferable to use an organic EL material as an EL layer, but the present invention can also be implemented using an inorganic EL material. However, current inorganic EL materials have an extremely high driving voltage, and therefore a TFT which has voltage resistance characteristics that can withstand the driving voltage must be used in cases of performing analog driving.

Alternatively, if inorganic EL materials having lower driving voltages than conventional inorganic EL materials are developed, then it is possible to apply them to the present invention.

Further, it is possible to freely combine the constitution of embodiment 16 with the constitution of any of embodiments 1 to 14.

Embodiment 17

An active matrix type EL display device (EL module) formed by implementing the present invention has superior visibility in bright locations in comparison to a liquid crystal display device because it is a self-emitting type device. It therefore has a wide range of uses as a direct-view type EL display (indicating a display incorporating an EL module).

Note that a wide viewing angle can be given as one advantage which the EL display has over a liquid crystal display. The EL display of the present invention may therefore be used as a display (display monitor) having a diagonal equal to 30 inches or greater (typically equal to 40 inches or greater) for appreciation of TV broadcasts by large screen.

Further, not only can it be used as an EL display (such as a personal computer monitor, a TV broadcast reception monitor, or an advertisement display monitor), it can be used as a display for various electronic devices.

The following can be given as examples of such electronic devices: a video camera; a digital camera; a goggle type display (head mounted display); a car navigation system; a personal computer; a portable information terminal (such as a mobile computer, a mobile telephone, or an electronic book); and an image playback device using a recording medium (specifically, a device which performs playback of a recording medium and is provided with a display which can display those images, such as a compact disk (CD), a laser disk (LD), or a digital video disk (DVD)). Examples of these electronic devices are shown in FIGS. 16A to 16F.

Figure 16A:
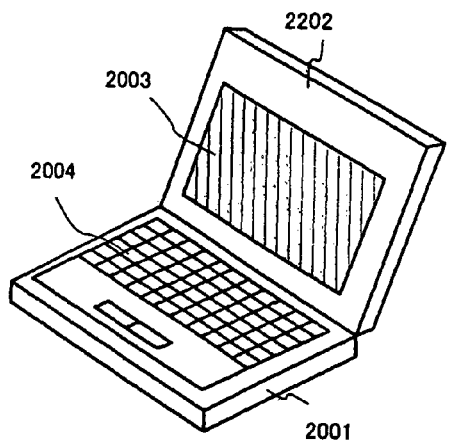
FIGS. 16A to 16F are diagrams showing specific examples of electronic equipment.

FIG. 16A is a personal computer, comprising a main body 2001, a casing 2002, a display portion 2003, and a keyboard 2004. The present invention can be used in the display portion 2003.

Figure 16B:
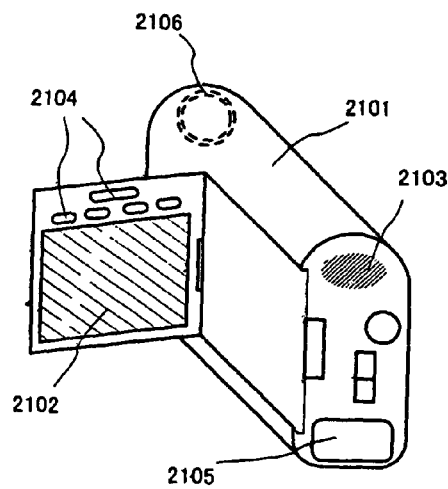

FIG. 16B is a video camera, comprising a main body 2101, a display portion 2102, an audio input portion 2103, operation switches 2104, a battery 2105, and an image receiving portion 2106. The present invention can be used in the display portion 2102.

Figure 16C:
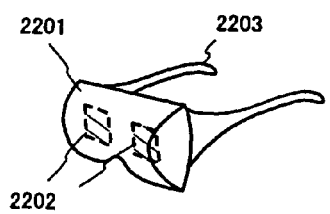

FIG. 16C is a goggle display, comprising a main body 2201, a display portion 2202, and an arm portion 2203. The present invention can be used in the display portion 2202.

Figure 16D:
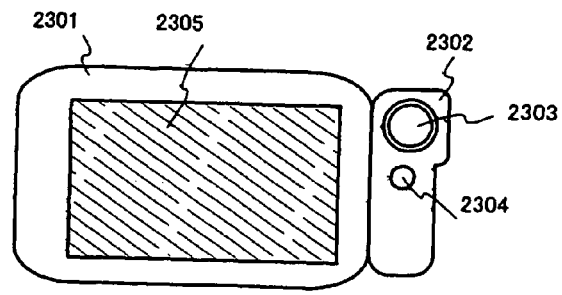

FIG. 16D is a mobile computer, comprising a main body 2301, a camera portion 2302, an image receiving portion 2303, operation switches 2304, and a display portion 2305. The present invention can be used in the display portion 2305.

Figure 16E:
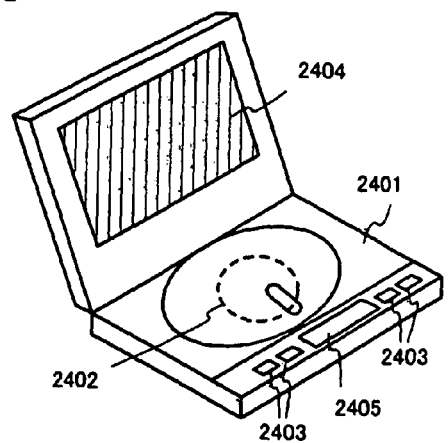

FIG. 16E is an image playback device (specifically, a DVD playback device) provided with a recording medium, comprising a main body 2401, a recording medium (such as a CD, an LD, or a DVD) 2402, operation switches 2403, a display portion (a) 2404, and a display portion (b) 2405. The display portion (a) is mainly used for displaying image information, and the image portion (b) is mainly used for displaying character information, and the present invention can be used in the image portion (a) and in the image portion (b). Note that the present invention can be used as an image playback device provided with a recording medium in devices such as a CD playback device and game equipment.

Figure 16F:
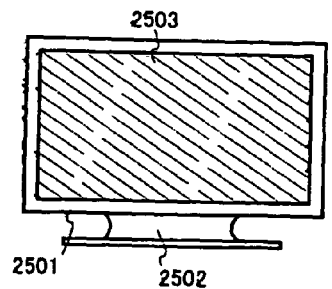

FIG. 16F is an EL display, containing a casing 2501, a support stand 2502, and a display portion 2503. The present invention can be used in the display portion 2503. The EL display of the present invention is especially advantageous for cases in which the screen is made large, and is favorable for displays having a diagonal greater than or equal to 10 inches (especially one which is greater than or equal to 30 inches).

Furthermore, if the emission luminance of EL materials becomes higher in future, then it will become possible to use the present invention in a front type or a rear type projector.

The above electronic devices are becoming more often used to display information provided through an electronic transmission circuit such as the Internet or CATV (cable television), and in particular, opportunities for displaying animation information are increasing. The response speed of EL materials is extremely high, and therefore EL displays are suitable for performing this type of display.

The emitting portion of the EL display device consumes power, and therefore it is preferable to display information so as to have the emitting portion become as small as possible. Therefore, when using the EL display device in a display portion which mainly displays character information, such as a portable information terminal, in particular, a portable telephone of a car audio system, it is preferable to drive it by setting non-emitting portions as background and forming character information in emitting portions.

Figure 20A:
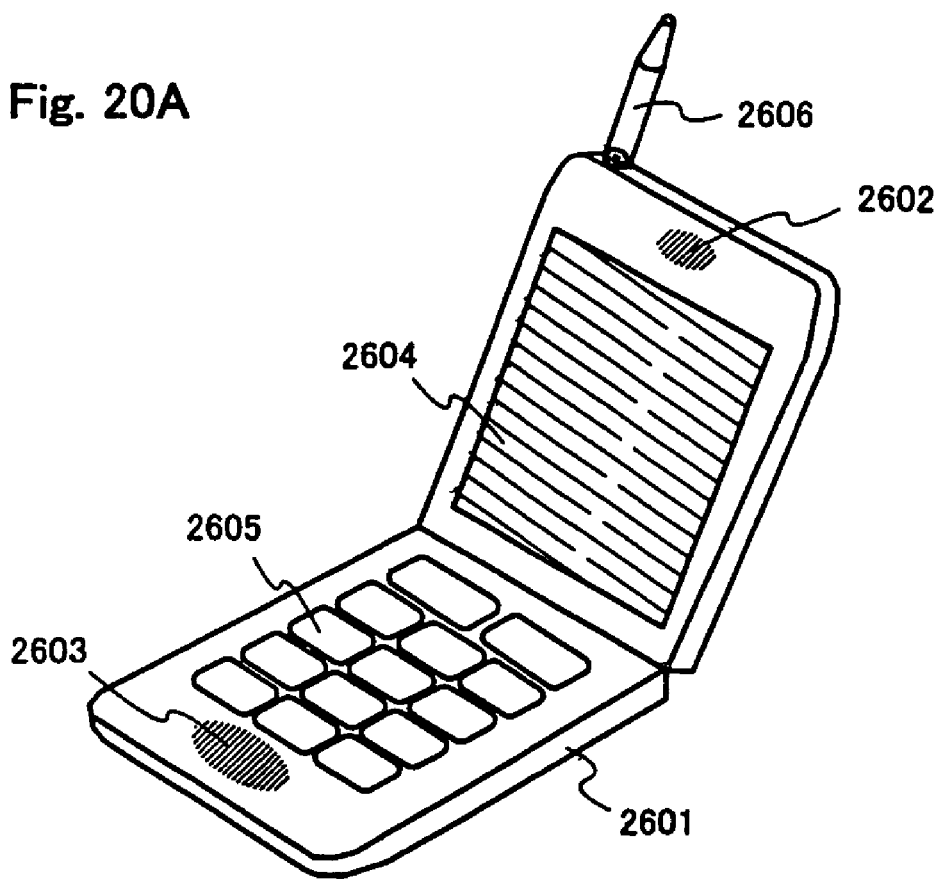
FIGS. 20A and 20B are diagrams showing specific examples of electronic equipment.

FIG. 20A is a portable telephone, comprising a main body 2601, an audio output portion 2602, an audio input portion 2603, a display portion 2604, operation switches 2605, and an antenna 2606. The EL display device of the present invention can be used in the display portion 2604. Note that by displaying white characters in a black background in the display portion 2604, the power consumption of the portable telephone can be reduced.

Figure 20B:
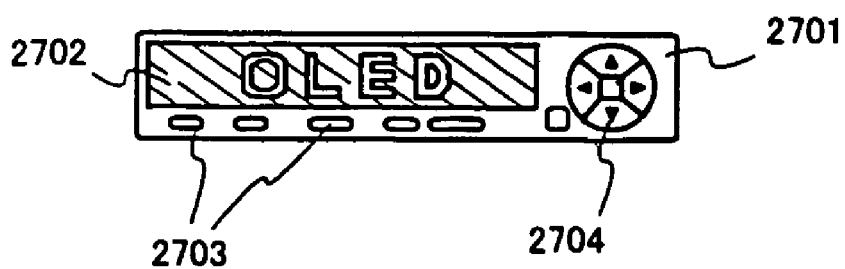

FIG. 20B is an on-board audio system (car audio system), containing a main body 2701, a display portion 2702, and operation switches 2703 and 2704. The EL display device of the present invention can be used in the display portion 2702. Furthermore, an on-board audio system is shown in embodiment 17, but a desktop type audio system may also be used. Note that by displaying white characters in a black background in the display portion 2702, the power consumption can be reduced.

The range of applications of the present invention is thus extremely wide, and it is possible to apply the present invention to electronic devices in all fields. Furthermore, the electronic devices of embodiment 17 can be realized by using any constitution of any combination of embodiments 1 to 16.

By using the present invention, it becomes possible to form a pixel in which TFTs, having optimal performance in response to the specifications required by elements, are formed on the same substrate, and the operation performance and reliability of an active matrix type EL display device can be greatly increased.

Furthermore, by using this type of EL display device as a display, it becomes possible to produce applied products (electronic equipment) having good image quality and durability (high reliability).

What is claimed is:

1. A semiconductor device comprising:
a first substrate over which a pixel portion is provided;
a wiring formed over the first substrate and outside the pixel portion, the wiring comprising a first portion, a second portion, and a third portion;
an EL element over the first substrate, the EL element comprising an EL layer interposed between a first electrode and a second electrode;
a second substrate over the EL element,
wherein the second substrate is bonded to the first substrate with an adhesive,
wherein the second substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the first substrate,
wherein the third portion of the wiring is located outside the first region, and
wherein a part of the first portion of the wiring is covered with the second electrode.

2. The semiconductor device according to claim 1, wherein the first substrate is a plastic substrate.

3. The semiconductor device according to claim 1, wherein the second substrate includes an organic resin.

4. The semiconductor device according to claim 1, wherein the EL layer contains an organic EL material.

5. The semiconductor device according to claim 1, wherein the EL layer contains an inorganic EL material.

6. The semiconductor device according to claim 1, wherein the semiconductor device is incorporated into an electronic device selected from the group consisting of a video camera, a digital camera, a goggle type display, a car navigation system, a personal computer, a mobile computer, a mobile telephone, an electronic book, and an image playback device.

7. The semiconductor device according to claim 1, wherein the second substrate is a glass substrate.

8. A semiconductor device comprising:
a first substrate over which a pixel portion is provided;
an insulating film formed over the first substrate;
a wiring formed over the insulating film and outside the pixel portion, the wiring comprising a first portion, a second portion, and a third portion;
an EL element over the first substrate, the EL element comprising an EL layer interposed between a first electrode and a second electrode;
a passivation film over the second electrode, the passivation film being in contact with the first portion of the wiring; and
a second substrate over the EL element,
wherein the second substrate is bonded to the first substrate with an adhesive,
wherein the second substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the insulating film,
wherein the third portion of the wiring is located outside the first region, and
wherein a part of the first portion of the wiring is covered with the second electrode.

9. The semiconductor device according to claim 8, wherein the EL layer contains an organic EL material.

10. The semiconductor device according to claim 8, wherein the EL layer contains an inorganic EL material.

11. The semiconductor device according to claim 8, wherein the semiconductor device is incorporated into an electronic device selected from the group consisting of a video camera, a digital camera, a goggle type display, a car navigation system, a personal computer, a mobile computer, a mobile telephone, an electronic book, and an image playback device.

12. The semiconductor device according to claim 8, wherein the second substrate is a glass substrate.

13. A semiconductor device comprising:
a first substrate over which a pixel portion is provided;
a wiring formed over the first substrate and outside the pixel portion, the wiring comprising a first portion, a second portion, and a third portion;
an EL element over the first substrate, the EL element comprising an EL layer interposed between a first electrode and a second electrode;
a passivation film over the second electrode, the passivation film being in contact with the first portion of the wiring;
a second substrate over the EL element; and
a drying agent provided between the EL element and the second substrate,
wherein the second substrate is bonded to the first substrate with an adhesive,
wherein the second substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the first substrate,
wherein the third portion of the wiring is located outside the first region, and
wherein a part of the first portion of the wiring is covered with the second electrode.

14. The semiconductor device according to claim 13, wherein the drying agent includes barium oxide.

15. The semiconductor device according to claim 13, wherein the pixel portion including the EL element is surrounded by the drying agent.

16. The semiconductor device according to claim 13, wherein the EL layer contains an organic EL material.

17. The semiconductor device according to claim 13, wherein the EL layer contains an inorganic EL material.

18. The semiconductor device according to claim 13, wherein the semiconductor device is incorporated into an electronic device selected from the group consisting of a video camera, a digital camera, a goggle type display, a car navigation system, a personal computer, a mobile computer, a mobile telephone, an electronic book, and an image playback device.

19. The semiconductor device according to claim 13, wherein the second substrate is a glass substrate.

20. A semiconductor device comprising:
a first substrate over which a pixel portion is provided;
a thin film transistor formed over the first substrate and in the pixel portion;
an interlayer insulating film formed over the thin film transistor;
a wiring formed over the first substrate and outside the pixel portion, the wiring comprising a first portion, a second portion, and a third portion;
an EL element, which is electrically connected to the thin film transistor, over the first substrate, the EL element including a first electrode, a second electrode, and an EL layer between the first and second electrodes; and
a second substrate over the EL element,
wherein the second substrate is bonded to the first substrate with an adhesive,
wherein the second substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and between the first substrate and the interlayer insulating film and electrically connected to the second electrode,
wherein the second portion of the wiring is located under the first region and interposed between the adhesive and the first substrate,
wherein the third portion of the wiring is located outside the first region, and
wherein a part of the first portion of the wiring is covered with the second electrode.

21. The semiconductor device according to claim 20, wherein the EL layer contains an organic EL material.

22. The semiconductor device according to claim 20, wherein the EL layer contains an inorganic EL material.

23. The semiconductor device according to claim 20, wherein the semiconductor device is incorporated into an electronic device selected from the group consisting of a video camera, a digital camera, a goggle type display, a car navigation system, a personal computer, a mobile computer, a mobile telephone, an electronic book, and an image playback device.

24. The semiconductor device according to claim 20, wherein the second substrate is a glass substrate.

25. The semiconductor device according to claim 20, wherein the interlayer insulating film is an organic resin.

26. The semiconductor device according to claim 20, wherein the semiconductor device further comprises an insulating layer formed over and in contact with the first substrate, and wherein the insulating layer is interposed between the first substrate and the wiring.

27. The semiconductor device according to claim 20, wherein the semiconductor device further comprises a passivation film formed between the first portion of the wiring and the interlayer insulating film.

28. The semiconductor device according to claim 20, wherein a contact hole which penetrates the interlayer insulating film is provided over the first portion of the wiring, and wherein the first portion of the wiring is electrically connected to the second electrode through the contact hole.

29. A car audio system comprising:
a display device, the display device comprising:
a first substrate over which a pixel portion is provided;
a wiring formed over the first substrate and outside the pixel portion, the wiring comprising a first portion, a second portion, and a third portion;
an EL element over the first substrate, the EL element comprising an EL layer interposed between a first electrode and a second electrode;
a second substrate over the EL element,
wherein the second substrate is bonded to the first substrate with an adhesive,
wherein the second substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the first substrate,
wherein the third portion of the wiring is located outside the first region, and
wherein a part of the first portion of the wiring is covered with the second electrode.

30. The car audio system according to claim 29, wherein the first substrate is a plastic substrate.

31. The car audio system according to claim 29, wherein the second substrate includes an organic resin.

32. The car audio system according to claim 29, wherein the EL layer contains an organic EL material.

33. The car audio system according to claim 29, wherein the EL layer contains an inorganic EL material.

34. The car audio system according to claim 29, wherein the second substrate is a glass substrate.

35. A car audio system comprising:
a display device, the display device comprising:
a first substrate over which a pixel portion is provided;
an insulating film formed over the first substrate;
a wiring formed over the insulating film and outside the pixel portion, the wiring comprising a first portion, a second portion, and a third portion;
an EL element over the first substrate, the EL element comprising an EL layer interposed between a first electrode and a second electrode;
a passivation film over the second electrode, the passivation film being in contact with the first portion of the wiring; and
a second substrate over the EL element,
wherein the second substrate is bonded to the first substrate with an adhesive,
wherein the second substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the insulating film,
wherein the third portion of the wiring is located outside the first region, and
wherein a part of the first portion of the wiring is covered with the second electrode.

36. The car audio system according to claim 35, wherein the EL layer contains an organic EL material.

37. The car audio system according to claim 35, wherein the EL layer contains an inorganic EL material.

38. The car audio system according to claim 35, wherein the second substrate is a glass substrate.

39. A car audio system comprising:
a display device, the display device comprising:
a first substrate over which a pixel portion is provided;
a wiring formed over the first substrate and outside the pixel portion, the wiring comprising a first portion, a second portion, and a third portion;
an EL element over the first substrate, the EL element comprising an EL layer interposed between a first electrode and a second electrode;
a passivation film over the second electrode, the passivation film being in contact with the first portion of the wiring;
a second substrate over the EL element; and
a drying agent provided between the EL element and the second substrate,
wherein the second substrate is bonded to the first substrate with an adhesive,
wherein the second glass substrate opposing the first substrate comprises a first thickness at a first region and a second thickness at a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the first substrate, wherein the third portion of the wiring is located outside the first region, and wherein a part of the first portion of the wiring is covered with the second electrode.

40. The car audio system according to claim 39, wherein the drying agent includes barium oxide.

41. The car audio system according to claim 39, wherein the pixel portion including the EL element is surrounded by the drying agent.

42. The car audio system according to claim 39, wherein the EL layer contains an organic EL material.

43. The car audio system according to claim 39, wherein the EL layer contains an inorganic EL material.

44. The car audio system according to claim 39, wherein the second substrate is a glass substrate.

45. A car audio system comprising:
a display device, the display device comprising:
  a first substrate over which a pixel portion is provided;
  a thin film transistor formed over the first substrate and in the pixel portion;
  an interlayer insulating film formed over the thin film transistor;
  a wiring formed over the first substrate and outside the pixel portion, the wiring comprising a first portion, a second portion, and a third portion;
  an EL element, which is electrically connected to the thin film transistor, over the first substrate, the EL element including a first electrode, a second electrode, and an EL layer between the first and second electrodes; and
  a second substrate over the EL element,
wherein the second substrate is bonded to the first substrate with an adhesive,
wherein the second substrate opposing the first substrate comprises a first thickness at a first region and a second thickness at a second region, the first region adhering to the first transistor with the adhesive, and the second region is located inside the first region and depressed relative to the first region,
wherein the first portion of the wiring is located under the second region and between the first substrate and the interlayer insulating film and electrically connected to the second electrode,
wherein the second portion of the wiring is located under the first region and interposed between the adhesive and the first substrate,
wherein the third portion of the wiring is located outside the first region, and
wherein a part of the first portion of the wiring is covered with the second electrode.

46. The car audio system according to claim 45, wherein the EL layer contains an organic EL material.

47. The car audio system according to claim 45, wherein the EL layer contains an inorganic EL material.

48. The car audio system according to claim 45, wherein the interlayer insulating film is an organic resin.

49. The car audio system according to claim 45, wherein the display device further comprises an insulating layer formed over and in contact with the first substrate, and wherein the insulating layer is interposed between the first substrate and the wiring.

50. The car audio system according to claim 45, wherein the display device further comprises a passivation film formed between the first portion of the wiring and the interlayer insulating film.

51. The car audio system according to claim 45, wherein a contact hole which penetrates the interlayer insulating film is provided over the first portion of the wiring, and wherein the first portion of the wiring is electrically connected to the second electrode through the contact hole.

52. A semiconductor device comprising:
a first substrate over which a pixel portion is provided;
a thin film transistor formed over the first substrate and in the pixel portion;
an interlayer insulating film formed over the thin film transistor;
a wiring formed over the first substrate and outside the pixel portion, the wiring comprising a first portion, a second portion, and a third portion;
an EL element over the first substrate, the EL element comprising an EL layer interposed between a first electrode and a second electrode;
a passivation film over the second electrode, the passivation film being in contact with the interlayer insulating film; and
a second substrate over the EL element,
wherein the second substrate is bonded to the first substrate with an adhesive,
wherein the second substrate comprises a first region and a second region, the first region adhering to the first substrate with the adhesive, and the second region is located inside the first region and depressed relative to the first region,
wherein the first portion of the wiring is located under the second region and electrically connected to the second electrode,
wherein the second portion of the wiring is located under the first region and interposed between the adhesive and the first substrate, and
wherein the third portion of the wiring is located outside the first region.

53. The semiconductor device according to claim 52, wherein the first substrate is a plastic substrate.

54. The semiconductor device according to claim 52, wherein the second substrate includes an organic resin.

55. The semiconductor device according to claim 52, wherein the EL layer contains an organic EL material.

56. The semiconductor device according to claim 52, wherein the EL layer contains an inorganic EL material.

57. The semiconductor device according to claim 52, wherein the semiconductor device is incorporated into an electronic device selected from the group consisting of a video camera, a digital camera, a goggle type display, a car navigation system, a personal computer, a mobile computer, a mobile telephone, an electronic book, and an image playback device.

* * * * *

UNITED STATES PATENT AND TRADEMARK OFFICE
CERTIFICATE OF CORRECTION

PATENT NO. : 7,741,775 B2  
APPLICATION NO. : 11/407145  
DATED : June 22, 2010  
INVENTOR(S) : Shunpei Yamazaki et al.

Page 1 of 1

It is certified that error appears in the above-identified patent and that said Letters Patent is hereby corrected as shown below:

column 1, line 37, "stitching" should read "switching"

column 4, line 31, "polycrystal line" should read "polycrystalline"

column 6, line 48, "alalkaline" should read "alkaline"

column 12, line 39, "polycrystal line" should read "polycrystalline"

column 12, line 40, "crystalization" should read "crystallization"

column 17, lines 29-30, "crystalli-ize" should read "crystallize"

column 24, line 24, "inter layer" should read "interlayer"

Signed and Sealed this  
Eighteenth Day of January, 2011

David J. Kappos  
*Director of the United States Patent and Trademark Office*